United States Patent
Koike et al.

(10) Patent No.: US 10,516,131 B2
(45) Date of Patent: Dec. 24, 2019

(54) ORGANIC ELECTROLUMINESCENCE DEVICE, METHOD FOR PRODUCING ORGANIC ELECTROLUMINESCENCE DEVICE, ILLUMINATION DEVICE, AND DISPLAY DEVICE

(71) Applicant: Sharp Kabushiki Kaisha, Sakai, Osaka (JP)

(72) Inventors: Eiji Koike, Sakai (JP); Katsuhiro Kikuchi, Sakai (JP); Shinichi Kawato, Sakai (JP); Satoshi Inoue, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 15/774,290

(22) PCT Filed: Nov. 30, 2016

(86) PCT No.: PCT/JP2016/085512
§ 371 (c)(1),
(2) Date: May 8, 2018

(87) PCT Pub. No.: WO2017/094760
PCT Pub. Date: Jun. 8, 2017

(65) Prior Publication Data
US 2019/0074464 A1 Mar. 7, 2019

(30) Foreign Application Priority Data
Dec. 3, 2015 (JP) .................................. 2015-236929

(51) Int. Cl.
*H01L 51/50* (2006.01)
*H05B 33/06* (2006.01)
(Continued)

(52) U.S. Cl.
CPC ........ *H01L 51/506* (2013.01); *H01L 51/5072* (2013.01); *H05B 33/06* (2013.01);
(Continued)

(58) Field of Classification Search
CPC .................................................... H01L 51/506
See application file for complete search history.

(56) References Cited

U.S. PATENT DOCUMENTS

2014/0159021 A1  6/2014  Song et al.

FOREIGN PATENT DOCUMENTS

JP    2005-062400 A    3/2005
JP    2008-226483 A    9/2008

OTHER PUBLICATIONS

Official Communication issued in International Patent Application No. PCT/JP2016/085512, dated Jan. 24, 2017.

*Primary Examiner* — Fernando L Toledo
*Assistant Examiner* — Valerie N Newton
(74) *Attorney, Agent, or Firm* — Keating & Bennett, LLP

(57) ABSTRACT

An organic EL device of one aspect of the disclosure includes: a base material; an insulating layer provided with a recessed portion on an upper face thereof; and a light-emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper layer side of the filling layer, an organic layer containing at least a light-emitting layer provided on an upper layer of the first electrode, a second electrode having optical transparency and provided on an upper layer side of the organic layer, and an edge cover layer covering at least an end portion of the first electrode, wherein the organic electroluminescence
(Continued)

device includes a plurality of unit light emitting regions separated from one another, an excavated portion is provided in the insulating layer between adjacent unit light emitting regions, and at last the filling layer is provided inside the excavated portion.

16 Claims, 20 Drawing Sheets

(51) Int. Cl.
*H05B 33/10* (2006.01)
*H05B 33/24* (2006.01)
*H05B 33/28* (2006.01)

(52) U.S. Cl.
CPC ............. *H05B 33/10* (2013.01); *H05B 33/24* (2013.01); *H05B 33/28* (2013.01)

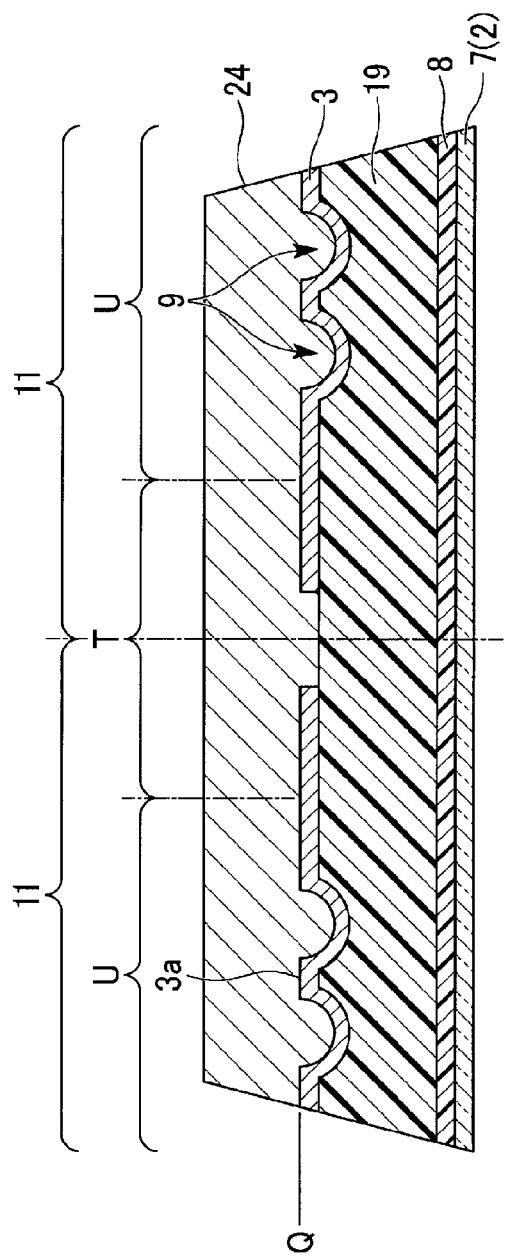

ORGANIC ELECTROLUMINESCENCE DEVICE, METHOD FOR PRODUCING ORGANIC ELECTROLUMINESCENCE DEVICE, ILLUMINATION DEVICE, AND DISPLAY DEVICE

TECHNICAL FIELD

Several aspects of disclosure relate to an organic electroluminescence device, a method for producing an organic electroluminescence device, an illumination device, and a display device.

This application claims priority from JP 2015-236929 A, filed Dec. 3, 2015 in Japan, the entirety of which is incorporated by reference herein.

BACKGROUND ART

The development of organic electroluminescence elements (organic EL elements) has been advanced in the past as candidates for next-generation display technology. Organic EL elements have a problem in that the light emitting efficiency thereof is low. To overcome this problem, there is a technique of increasing the light extraction efficiency by forming a reflective layer in a recessed portion produced on the substrate side. A resin layer (filling layer) needs to be formed to fill the recessed portion between a reflective electrode and an organic layer as well as a transparent electrode layer. This is problematic in that it leads to an increase in the number of production steps or film thickness irregularities in the resin layer. In addition, the film thickness becomes large because the resin layer is also formed in the wide region between adjacent sub-pixels. Therefore, when cutting down the resin layer located in regions other than the recessed portion, the process takes time, and film thickness irregularities arise.

Further, when the amount of a resin material that is applied is large in the formation of the resin layer, this causes the forming precision to decrease. Therefore, there is also a method of reducing the coated film thickness by increasing the revolution speed during spin coating, but this method also has limitations.

PTL 1 describes a configuration including a support substrate, a plurality of organic EL elements configured to emit light as independent display pixels on the support substrate, and a light reflective layer configured to reflect light emitted from the plurality of organic EL elements to the support substrate side. In particular, the light reflective layer includes a plurality of recessed portions, each of which is distanced from the plurality of organic EL elements via a light-transmissive insulating film to orient the reflected light toward the corresponding organic EL elements. With this configuration, light emitted from the display elements can be utilized effectively.

CITATION LIST

Patent Literature

PTL 1: JP 2005-62400 A

SUMMARY

Technical Problem

With the known configuration, the structure is such that a reflective layer is provided to reflect the light of the organic EL elements, and a plurality of light-transmissive insulating films are interposed between the recessed portions and the organic EL elements, but the film thickness increases during the resin layer forming process. When the film thickness of the resin layer is large, the amount of light scattered in the lateral direction increases, which leads to a problem in that the light extraction efficiency decreases.

One aspect of the disclosure was conceived in light of the problems of the known technology described above, and an object thereof is to provide an organic electroluminescence device, a method for producing an organic electroluminescence device, an illumination device, and a display device capable of shortening the production process and enhancing the light extraction efficiency.

Solution to Problem

The organic electroluminescence device of one aspect of the disclosure includes: a base material; an insulating layer provided on the base material and provided with a recessed portion on an upper face thereof; and a light-emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper layer side of the filling layer, an organic layer containing at least a light-emitting layer provided on an upper layer of the first electrode, a second electrode having optical transparency and provided on an upper layer side of the organic layer, and an edge cover layer covering at least an end portion of the first electrode, wherein the organic electroluminescence device includes a plurality of unit light emitting regions separated from one another, an excavated portion is provided in the insulating layer between adjacent unit light emitting regions, and at last the filling layer is provided inside the excavated portion.

In the organic electroluminescence device of one aspect of the disclosure, an upper face of the filling layer at a position of the recessed portion may be positioned above a plane including an upper face of the reflective layer.

In the organic electroluminescence device of one aspect of the disclosure, an upper face of the filling layer at a position of the recessed portion may be positioned below a plane including an upper face of the reflective layer.

In the organic electroluminescence device of one aspect of the disclosure, the base material may be exposed via a first through-hole formed in the insulating layer at a position of the excavated portion.

In the organic electroluminescence device of one aspect of the disclosure, the edge cover layer covering the end portions of the reflective layer and the first electrode may be provided inside the excavated portion.

In the organic electroluminescence device of one aspect of the disclosure, the end portion of the reflective layer may be formed to be positioned inside the excavated portion.

In the organic electroluminescence device of one aspect of the disclosure, an active element, whose light emission can be controlled independently for each unit light emitting region, may be provided.

In the organic electroluminescence device of one aspect of the disclosure, an electrode wiring line of the active elements and the reflective layer may be provided inside the excavated portion with an insulating film interposed therebetween.

In the organic electroluminescence device of one aspect of the disclosure, the base material may be exposed via a second through-hole formed in the electrode wiring line.

In the organic electroluminescence device of one aspect of the disclosure, the width of the excavated portion may be larger than the diameter of the recessed portion.

The method for producing an organic electroluminescence device according to one aspect of the disclosure includes: forming a recessed portion and an excavated portion in an insulating layer provided on a base material; forming a reflective layer at least along a surface of the recessed portion; forming a filling layer having optical transparency on the inside of the recessed portion with the reflective layer interposed between the filling layer and the recessed portion; forming a first electrode having optical transparency on at least an upper layer side of the filling layer; forming an organic layer containing at least a light-emitting layer on an upper layer side of the first electrode; and forming a second electrode having optical transparency and light reflectivity on an upper layer side of the organic layer, wherein when forming the recessed portion and the excavated portion, the recessed portion is formed in unit light emitting regions separated from one another, and the excavated portion is formed between adjacent unit light emitting regions.

The method for producing an organic electroluminescence device according to one aspect of the disclosure may be a production method wherein, when forming the filling layer, at least portions of the reflective layer at the positions of the recessed portion and the excavated portion are exposed by subjecting the light-transmissive resin film formed on the base material to ashing.

The production method for an organic electroluminescence device according to one aspect of the disclosure may be a production method wherein, when forming the excavated portion, the insulating layer is penetrated in the film thickness direction at the position of the excavated portion.

The production method for an organic electroluminescence device according to one aspect of the disclosure may be a production method including forming an active element, whose light emission can be controlled independently for each unit light emitting region, on the base material; wherein in this step, the electrode wiring line of the active element is penetrated in the film thickness direction at the position of the excavated portion.

The illumination device of one aspect of the disclosure includes: a base material; an insulating layer provided on the base material and provided with a recessed portion on an upper face thereof; and a light-emitting element including a reflective layer provided on at least a surface of the recessed portion, a filling layer having optical transparency and filling the inside of the recessed portion with the reflective layer interposed therebetween, a first electrode having optical transparency and provided on at least an upper layer side of the filling layer, an organic layer containing at least a light-emitting layer provided on an upper layer of the first electrode, a second electrode having optical transparency and provided on an upper layer side of the organic layer, and an edge cover layer covering at least an end portion of the first electrode, wherein the organic electroluminescence device includes a plurality of unit light emitting regions separated from one another, an excavated portion is provided in the insulating layer between adjacent unit light emitting regions, and at last the filling layer is provided inside the excavated portion.

The display device of one aspect of the disclosure includes: a base material; an insulating layer provided on the base material and provided with a recessed portion on an upper face thereof; and a light-emitting element including a reflective layer provided on at least a surface of the recessed portion, a filling layer having optical transparency and filling the inside of the recessed portion with the reflective layer interposed between the filling layer and the recessed portion, a first electrode having optical transparency and provided on at least an upper layer side of the filling layer, an organic layer containing at least a light-emitting layer provided on an upper layer of the first electrode, a second electrode having optical transparency and provided on an upper layer side of the organic layer, and an edge cover layer covering at least an end portion of the first electrode, wherein the organic electroluminescence device includes a plurality of unit light emitting regions separated from one another, an excavated portion is provided in the insulating layer between adjacent unit light emitting regions, and at last the filling layer is provided inside the excavated portion.

Advantageous Effects of Invention

According to several aspects of the disclosure, an organic electroluminescence device, a method for producing an organic electroluminescence device, an illumination device, and a display device capable of shortening the production process and enhancing the light extraction efficiency can be provided.

BRIEF DESCRIPTION OF DRAWINGS

FIG. 8A is a cross-sectional view illustrating an organic EL element of a comparative example in which a recessed portion structure is provided in a light emission area.

DESCRIPTION OF EMBODIMENTS

Figure 1:
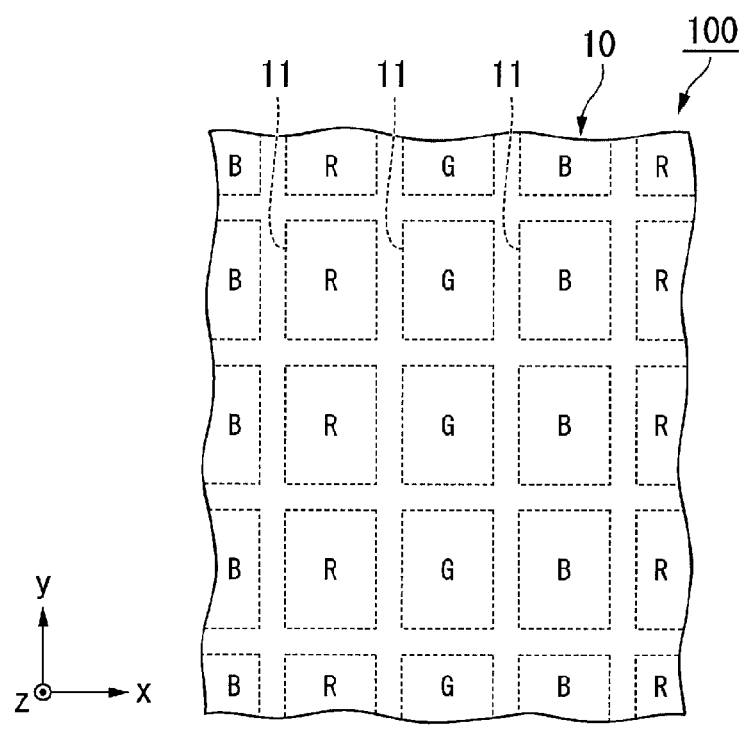
FIG. 1 is a drawing illustrating a display region of an organic EL device of a first embodiment.

An organic electroluminescence device (organic EL device) of a first embodiment of the disclosure will be described hereinafter. The organic EL device of each embodiment of the disclosure is an example of a top-emitting organic EL device employing a microcavity structure.

Note that in each of the figures below, the dimensional scale is illustrated differently depending on the component, such that each component is easily visible. In addition, the light extraction direction is the upward direction in the drawings.

First Embodiment

An organic EL device of a first embodiment will be described hereinafter.

FIG. 1 is a drawing illustrating a display region of an organic EL device of the first embodiment.

Figure 2:
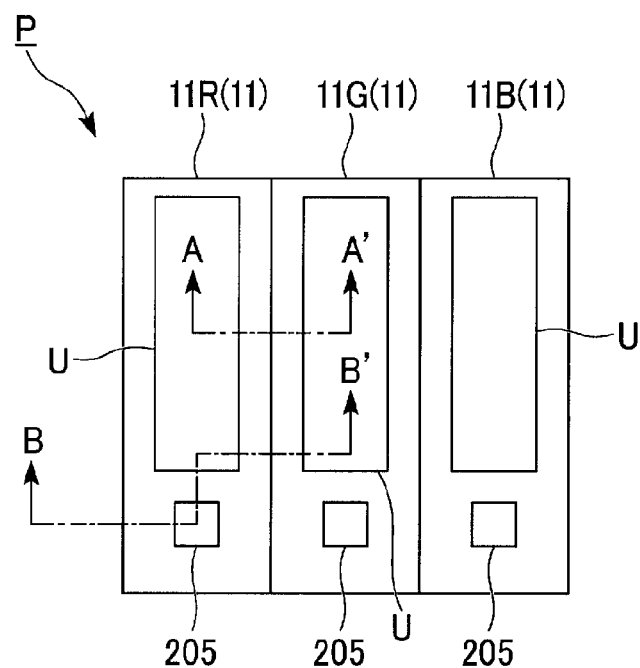
FIG. 2 is a plan view illustrating one pixel in the organic EL device of the first embodiment.

FIG. 2 is a plan view illustrating one pixel in the organic EL device of the first embodiment.

Figure 3:
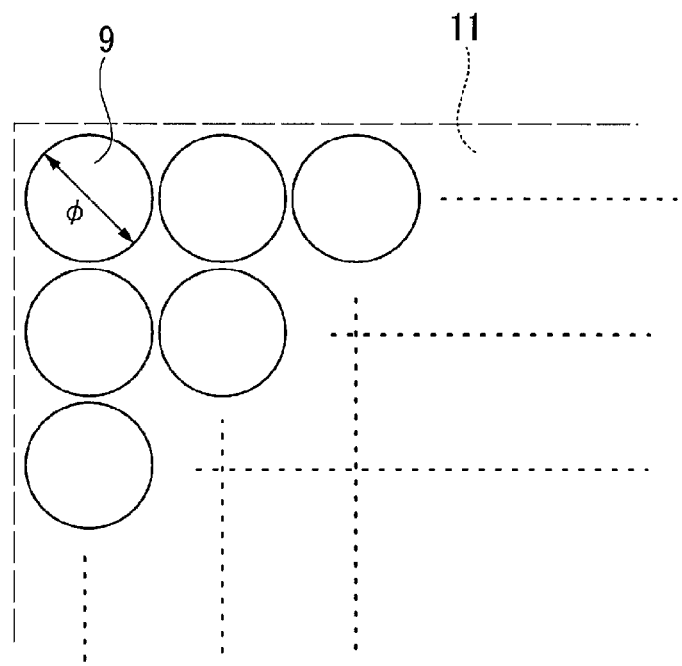
FIG. 3 is a magnified plan view illustrating a portion of the sub-pixel in FIG. 2.

FIG. 3 is a magnified plan view illustrating a portion of the sub-pixel in FIG. 2.

Figure 4:
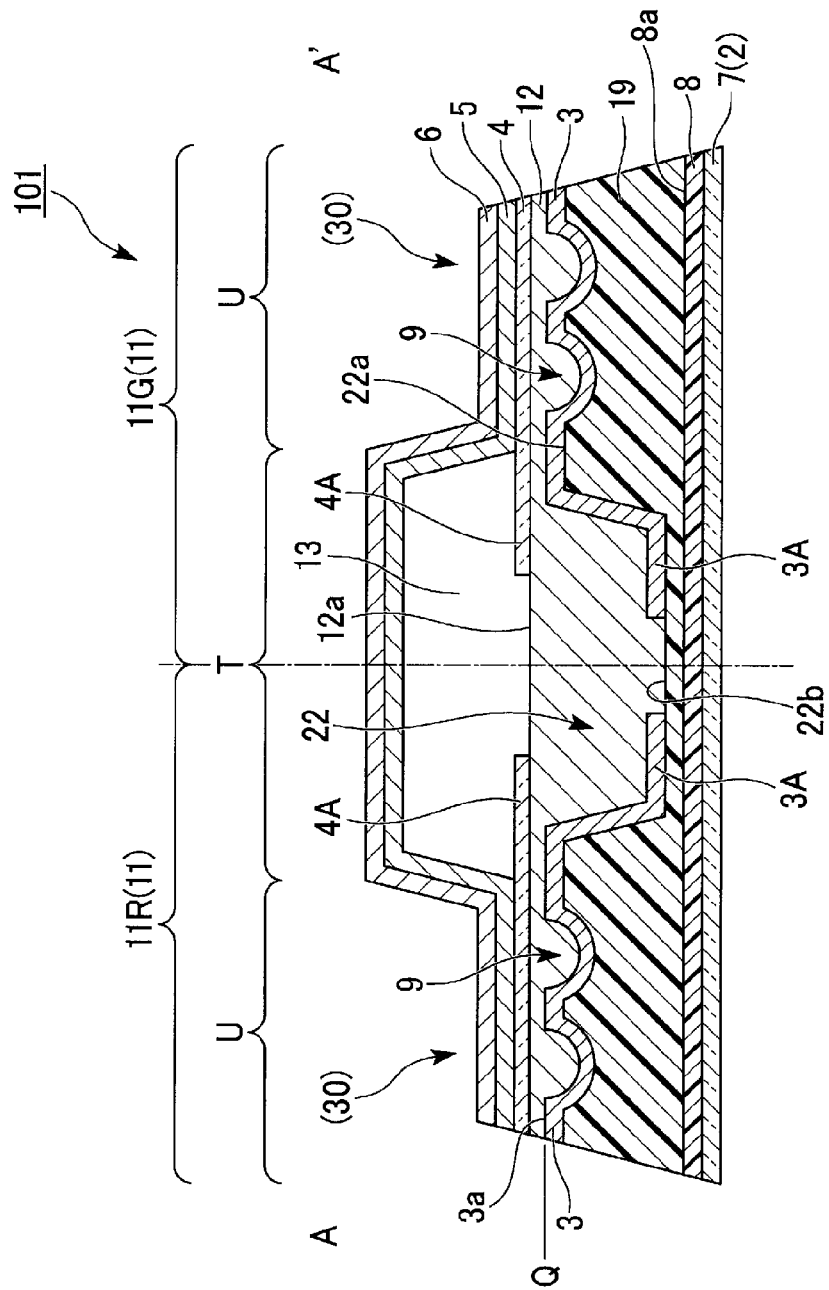
FIG. 4 is a drawing illustrating the configuration between sub-pixels and is a cross-sectional view along line A-A' in FIG. 2.

FIG. 4 is a drawing illustrating the configuration between sub-pixels and is a cross-sectional view along line A-A' in FIG. 2.

As illustrated in FIG. 1, the organic EL device (organic electroluminescence device, illumination device, and display device) 100 of this embodiment includes a plurality of unit light emitting regions 11 separated from one another. Here, the organic EL device includes a display region 10 including a plurality of unit light emitting regions 11 corresponding to RGB. Each unit light emitting region 11 extends in a striped shape along the y-axis and is arranged repeatedly in the order of RGB along the x-axis. In FIG. 1, an example in which each unit light emitting region 11 for RGB is arranged in a striped pattern is illustrated, but this embodiment is not limited to this configuration. The arrangement of each unit light emitting region 11 for RGB may also have a known RGB pixel arrangement such as a mosaic arrangement or a delta arrangement.

Each unit light emitting region 11 for RGB may employ an illumination device configured to produce white light by emitting red light, green light, and blue light simultaneously. However, the application of the organic EL device 100 is not limited to an illumination device. For example, the organic EL device 100 may also be applied to a display device in which each of the unit light emitting regions 11 corresponding to red, green, and blue forms a red sub-pixel 11R, a green sub-pixel 11G, and a blue sub-pixel 11B as illustrated in FIG. 2, and these three sub-pixels 11R, 11G, and 11B constitute one pixel.

Note that when no distinction is made between the sub-pixels 11R, 11G, and 11B, they are simply referenced as sub-pixels 11.

Here, as one example, the sizes of the respective sub-pixels 11 are all the same at 0.078 mm×0.026 mm, and the size of one pixel P is 90 μm×90 μm.

A plurality of recessed portions 9 having a circular shape in a plan view, as illustrated in FIG. 3, are formed in each of the sub-pixels 11R, 11G, and 11B. The diameter φ of the recessed portions 9 is, for example, approximately from 5 to 7 μm. The plurality of recessed portions 9 are arranged regularly in the vertical and horizontal directions at a pitch of 7 μm to form a lattice. The density of the recessed portions 9 is such that the proportion of the entire area of the plurality of recessed portions 9 occupying the light emission area in the sub-pixel 11 is 70%.

As illustrated in FIG. 4, the organic EL device 100 of this embodiment includes a display panel (not illustrated) including a TFT array substrate 101, a plurality of thin film transistors (not illustrated) provided in a prescribed arrangement with respect to the plurality of sub-pixels 11 in the display region, various wiring lines (not illustrated) connected to each thin film transistor, and a sealing substrate (not illustrated) provided so as to cover the plurality of thin film transistors and the various wiring line. The thin film transistors and the organic EL elements (light emitting element) 30 are electrically connected via a reflective layer 3 and a contact portion 205 (FIG. 2).

One pixel 1 is divided into three sub-pixels 11, and each sub-pixel 11 is driven independently of one another. Any color can be therefore displayed depending on the manner in which each sub-pixel 11 emits light.

As illustrated in FIG. 4, the TFT array substrate 101 includes a substrate 2, a reflective layer 3, a first electrode 4, an organic layer 5 including a light-emitting layer, a second electrode 6, and an edge cover layer 13 and also includes an organic EL element 30 provided for each sub-pixel 11.

Specifically, the substrate 2 includes a base material 7 and an underlayer (not illustrated). A TFT layer 8, a flattening resin layer (resin layer) 19, the reflective layer 3, the first electrode 4, the edge cover layer 13, the organic layer 5 including a light-emitting layer, and the second electrode 6 are layered in this order from the base material 7 side on the upper face of the base material 7. The organic EL element 30 is formed on a plurality of recessed portions (first recessed portions) 9 formed in the flattening resin layer (insulating layer) 19. The organic EL element 30 includes a reflective layer 3, a filling layer 12, a first electrode 4, an organic layer 5 including a light-emitting layer, and a second electrode 6. The organic EL device 100 is a top-emitting organic EL device in which light emitted by the light-emitting layer is emitted from the second electrode 6 (light-emitting face) side.

A glass substrate or a flexible polyimide substrate, for example, is employed as the base material 7. Note that since the organic EL device 100 is a top-emitting organic EL device, the base material 7 does not necessarily have optical transparency, and, for example, a semiconductor substrate such as a silicon substrate may be employed.

The flattening resin layer 19 is made of a photosensitive resin, such as an acrylic, an epoxy, or a polyimide resin, for example. Employing a photosensitive resin in the material of the flattening resin layer 19 is well-suited to the method for forming the recessed portions 9, described later. However, when a method other than the forming method described later is applied, the material configuring the flattening resin layer 19 need not be photosensitive. Further, the constituent material of the flattening resin layer 19 may be a material other than a resin, and an inorganic material may also be used.

The film thickness of the flattening resin layer 19 is set to 4 μm, for example.

A plurality of recessed portions 9 are formed in the flattening resin layer 19 in a light emission area U inside each of the sub-pixels 11. Each recessed portion 9 opens upward in the upper face 19a of the flattening resin layer 19, and the cross-sectional shape thereof is an arc shape. That is, the inner surface of each recessed portion 9 forms part of a three-dimensional spherical surface. Note that the shape is not limited to an arc shape. The depth of the recessed portion 9 is set to 1 μm, for example.

An excavated portion 22 having a rectangular shape in a plan view is formed in the flattening resin layer 19 between the light emission areas U of adjacent sub-pixels 11. The excavated portion 22 can be produced by a known half exposure method using a photomask. The excavated portion 22 is excavated in the film thickness direction from the upper face 19a of the flattening resin layer 19, and the depth thereof is greater than the depth of the recessed portion 9.

The depth of the excavated portion 22 is set to 3 μm, for example. Therefore, the film thickness of the flattening resin layer in the excavated portion 22 is 1 μm, for example. In addition, the opening width in the vertical and horizontal directions of the excavated portion 22 is set to 78 μm×10 μm, for example. The excavated portion 22 opens upward in the upper face 19a of the flattening resin layer 19, and the cross-sectional shape thereof is a trapezoidal shape. Note that the shape is not limited to a trapezoidal shape.

The reflective layer 3 is provided for each sub-pixel 11 and is formed in the light emission area U of each sub-pixel 11. As illustrated in FIG. 5A and FIGS. 6A to 6D, the reflective layer 3 is formed on the upper face 19a of the flattening resin layer 19 including the inner faces of a plurality of recessed portions 9. Here, the reflective layer 3 may be formed continuously across a plurality of recessed portions 9 or may be formed discontinuously for each recessed portion 9. A metal having high reflectance such as aluminum or silver is preferably used as the material configuring the reflective layer 3. In the case of the present embodiment, the reflective layer 3 is configured by, for example, an aluminum vapor deposition film having a film thickness of 100 nm.

The reflective layer 3 is provided not only on the inside of the recessed portion 9, but also on the inside of the excavated portion 22. Specifically, the end portion 3A of the reflective layer 3 is positioned inside the excavated portion 22. The end portion 3A of the reflective layer 3 extends along the base 22b of the excavated portion 22 and faces the end portions 3A of the reflective layer 3 provided on other adjacent sub-pixels 11 at a prescribed distance in the base 22b.

A filling layer 12 is filled into the inside of each of the recessed portions 9 and the excavated portions 22 with the reflective layer 3 interposed therebetween. The filling layer 12 is provided over the entire surface of the substrate 2 to cover the upper face 3a of the reflective layer 3. An upper face 12a of the filling layer 12 in this embodiment is positioned higher than a plane Q including an upper face 3a of the reflective layer 3. The distance between the upper face 12a of the filling layer 12 on the flat surface and the plane Q including the upper face 3a of the reflective layer 3—that is, the minimum film thickness of the filling layer—is set to 1 μm, for example.

The filling layer 12 is made of a light-transmissive resin. Specifically, an acrylic resin having a transmittance of 95% is used for the material of the filling layer 12.

The refractive index of the filling layer 12 of this embodiment is, for example, 1.5.

A plurality of first electrodes 4 are provided for each sub-pixel 11. The first electrodes 4 are formed on the upper face 12a of the filling layer 12 and are provided in regions excluding the periphery of the sub-pixels 11. Therefore, a portion of the upper face 12a of the filling layer 12 is exposed from between first electrodes 4 provided in adjacent sub-pixels 11.

In the case of this embodiment, the first electrodes 4 are provided on the reflective layer 3 with the filling layer 12 interposed therebetween and are electrically conductive with the reflective layer 3 outside the light emission area U of each sub-pixel 11. Specifically, as illustrated in FIG. 2, the first electrodes 4 and the reflective layer 3 are conductive in a contact portion 205 provided outside the light emission area U of each sub-pixel 11. The contact portion 205 communicates with a thin film transistor (not illustrated), and the reflective layer 3 and the thin film transistor are conductive via the contact portion 205 (FIG. 2).

The first electrode 4 is a transparent electrode configured by a transparent conductive film such as indium tin oxide (ITO) or indium zinc oxide (IZO), and has optical transparency. In the case of the present embodiment, the first electrode 4 is configured by, for example, ITO having a film thickness of 120 nm. The first electrode 4 functions as a positive electrode for injecting holes into the organic layer 5.

As illustrated in FIG. 4, the edge cover layer 13 is provided at the boundary portion of adjacent sub-pixels 11 and is provided between the light emission areas U. The edge cover layer 13 is formed on the filling layer 12 while covering the end portion 4A of each of the first electrodes 4 provided on each of the adjacent sub-pixels 11.

The same material as that of the filling layer 12 described above may be used for the edge cover layer 13, and the edge cover layer 13 is formed by an ordinary photoetching process. The edge cover layer 13 defines the light emission area U with a prescribed pattern.

The organic layer 5 is formed across adjacent sub-pixels and is layered on the first electrode 4 in the light emission area U and on the edge cover layer 13 in the non-emitting area T.

The organic layer 5 is a layered body formed from an organic material. The organic layer 5 includes a hole injecting layer, a hole transport layer, a light-emitting layer, an electron transport layer, and an electron injecting layer. A detailed description of the configuration and functioning of each layer configuring the organic layer 5 is given later.

The second electrode 6 is layered across the upper face of the organic layer 5. In the case of the present embodiment, the second electrode 6 is, for example, a translucent electrode formed from a vapor deposition film made of magnesium silver (MgAg) having a film thickness of 1 nm and silver (Ag) having a film thickness of 19 nm and having transflectivity. The second electrode 6 functions as a negative electrode for injecting electrons into the organic layer 5. Note that a transparent electrode formed from a transparent conductive film such as indium tin oxide (ITO) or indium zinc oxide (IZO), for example, may also be used as the second electrode 6. At this time, for example, an ITO film having a film thickness of 70 nm is formed.

In this embodiment, in the light emission area U where the recessed portions 9 in the sub-pixels 11 are formed, the region sandwiched by the first electrode 4 and the second electrode 6 forms a microcavity structure. Light emitted from the light-emitting layer undergoes multiple reflection between the first electrode 4 and the second electrode 6. At this time, specific wavelength components of the light emitted from the light-emitting layer are intensified. Moreover, although omitted from the illustration in FIG. 4, an optical adjustment layer known as a cap layer is layered onto the upper face of the second electrode 6. Note that when the second electrode 6 is a transparent electrode, it is not necessary to provide the cap layer described above.

Figure 5A:
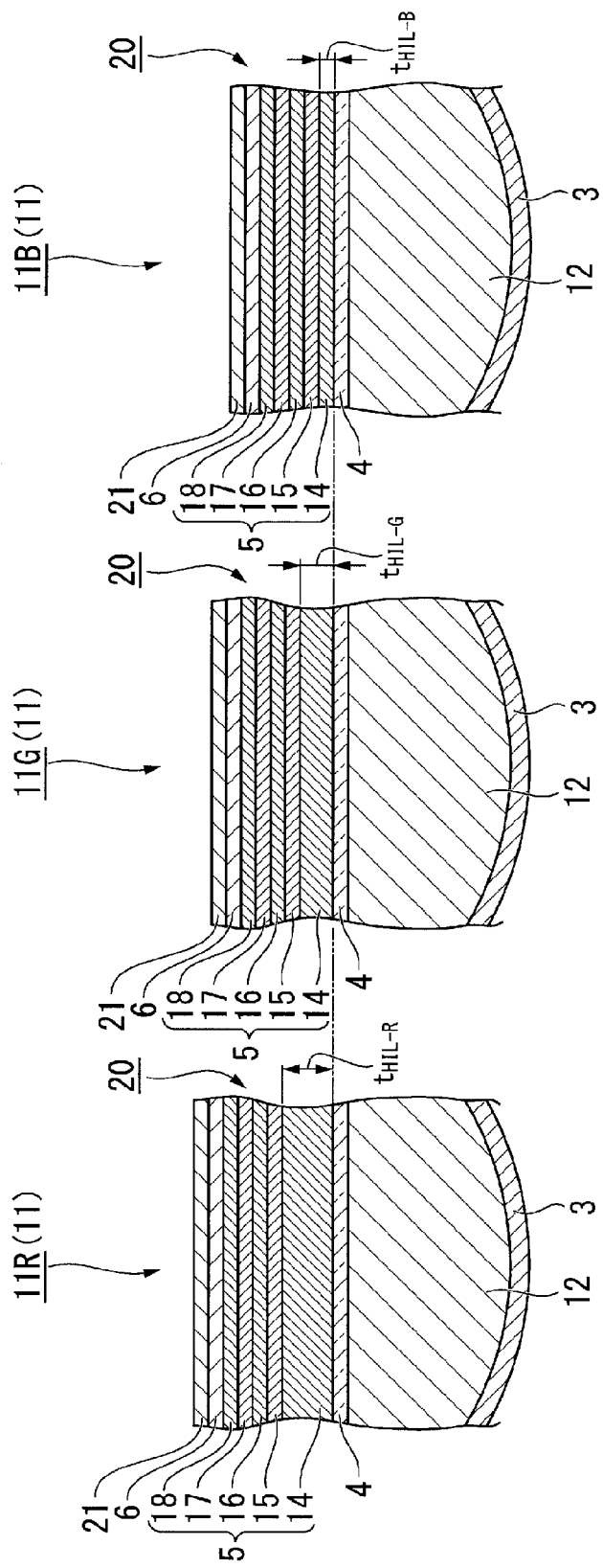
FIG. 5A is a cross-sectional view illustrating the details of the recessed portion structure in the sub-pixel.

FIG. 5A is a cross-sectional view illustrating the details of the recessed portion structure in the sub-pixel.

FIG. 5A is a magnified view of the structure of one of the plurality of recessed portions forming the organic EL element 30. In addition, the recessed portion structure of the organic EL elements 30 of the three sub-pixels 11R, 11G, and 11B differ only in the film thickness of the hole injecting layer, and the same basic configuration is shared.

As illustrated in FIG. 5A, in the recessed portion structure (light extraction structure), the organic layer 5 is provided on the upper layer of the first electrode 4. The organic layer 5 is formed from a layered film including a hole injecting layer 14, a hole transport layer 15, a light-emitting layer 16, an electron transport layer 17, and an electron injecting layer 18 layered from the first electrode 4 side thereof.

However, layers other than the light-emitting layer 16 may be appropriately introduced as necessary. In addition, a single layer may serve as both a transport layer and an injecting layer. In the present embodiment, as described above, an example is given of an organic layer having a 5-layer structure of the hole injecting layer 14, the hole transport layer 15, the light-emitting layer 16, the electron transport layer 17, and the electron injecting layer 18. Moreover, as necessary, a layer for preventing migration of charge to the opposite side electrode, such as a hole blocking layer or an electron blocking layer, may be appropriately added.

The hole injecting layer 14 is a layer that functions to increase the efficiency of injecting holes from the first electrode 4 to the light-emitting layer 16. Examples that may be employed as the material of the hole injecting layer 14 include benzine, styrylamine, triphenylamine, porphyrin, triazole, imidazole, oxadiazole, polyarylalkane, phenylene diamine, arylamine, oxazole, anthracene, fluorenone, hydrazone, stilbene, triphenylene, azatriphenylene, and derivatives thereof; and heterocyclic, conjugated monomers, oligomers, polymers, and the like of an polysilane-based compound, a vinylcarbazole-based compound, a thiophene-based compound, an aniline-based compound, or the like. Molybdenum oxide may be blended with these organic materials. The blending ratio of the organic material and the molybdenum oxide is, for example, approximately 80% organic material, and approximately 20% molybdenum oxide.

The hole transport layer 15 is a layer that functions to increase the efficiency of hole transport from the first electrode 4 to the light-emitting layer 16. An organic material similar to the hole injecting layer 14 may be employed for the hole transport layer 15. Note that the hole injecting layer 14 and the hole transport layer 15 may be a single body, or may be formed as individual layers.

The light-emitting layer 16 functions to emit light when holes injected from the first electrode 4 side recombine with electrons injected from the second electrode 6 side and the holes and the electrons release energy. The material of the light-emitting layer 16 is configured by, for example, a host material and a dopant material. The material of the light-emitting layer 16 may also include an assist material. The host material is included at the highest ratio among the constituent materials in the light-emitting layer 16. For example, the blending ratio of the host material and the dopant material is approximately 90% host material and approximately 10% dopant material. The host material facilitates formation of the light-emitting layer 16 and functions to maintain the film state of the light-emitting layer 16. Accordingly, it is desirable that the host material is a stable compound that does not easily crystallize after film formation and does not easily undergo chemical change. Moreover, when an electric field is applied between the first electrode 4 and the second electrode 6, the host material functions such that recombination of carriers occurs within the host molecules, and excitation energy is transferred to the dopant material, causing the dopant material to emit light. The light-emitting layer 16 is formed in each sub-pixel region and is separated for each color of RGB. The thickness of the light-emitting layer 16 is, for example, approximately 60 nm.

Specific examples of materials of the light-emitting layer 16 include materials that include a material having a high light-emission efficiency, such as a low-molecular fluorescent colorant, a fluorescent macromolecule, or a metal complex. Examples of the material of the light-emitting layer 16 include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene, and derivatives thereof; tris(8-quinolinato)aluminum complex; bis(benzoquinolinato)beryllium complex; tri (dibenzoylmethyl)phenanthroline europium complex; and ditoluylvinylbiphenyl.

The electron transport layer 17 functions to increase the efficiency of electron transport from the second electrode 6 to the light-emitting layer 16. As the material of the electron transport layer 17, for example, quinoline, perylene, phenanthroline, bisstyryl, pyrazine, triazole, oxazole, oxadiazole, fluorenone, and derivatives and metal complexes thereof can be employed. Specifically, for example, tris(8-hydroxyquinoline)aluminum, anthracene, naphthalene, phenanthrene, pyrene, anthracene, perylene, butadiene, coumarin, acridine, stilbene, 1,10-phenanthroline, and derivatives and metal complexes thereof can be employed. The thickness of the electron transport layer 17 is, for example, approximately 15 nm.

The electron injecting layer 18 functions to increase the efficiency of electron injection from the second electrode 6 to the light-emitting layer 16. As the material of the electron injecting layer 18, for example, compounds such as calcium metal (Ca) or lithium fluoride (LiF) can be employed. Note that the electron transport layer 17 and the electron injecting layer 18 may be a single body, or may be formed as individual layers. The thickness of the electron injecting layer 18 is, for example, approximately 0.5 nm.

The microcavity structure 20 has an effect of intensifying light of a specific wavelength by utilizing the resonance of light occurring between the first electrode 4 and the second electrode 6. In the case of this embodiment, the wavelength of light emitted from each of the red, green, and blue sub-pixels 11R, 11G, and 11B differs from one another. Therefore, the optical path length between the first electrode 4 and the second electrode 6 corresponds to the light emission spectrum peak wavelength of each color. Each optical path length is set such that the optical path length of the red sub-pixel 11R is the longest, the optical path length of the blue sub-pixel 11B is the shortest, and the optical path length of the green sub-pixel 11G is an intermediate length therebetween.

There are various techniques for varying each of the optical path lengths of the microcavity structure 20 for each of the sub-pixels 11R, 11G, and 11B. Here, a technique of varying the length of the hole injecting layer 14 is employed from the perspective of minimizing the effects on resistance. When the layer thickness of the hole injecting layer 14 of the red sub-pixel 11R is defined as $t_{HIL-R}$, the layer thickness of the hole injecting layer 14 of the green sub-pixel 11G is defined as $t_{HIL-G}$, and the layer thickness of the hole injecting layer 14 of the blue sub-pixel 11B is defined as $t_{HIL-B}$, the relationship $t_{HIL-R} > t_{HIL-G} > t_{HIL-B}$ holds.

Light emitted from the organic layer 5 due to the microcavity structure 20 is repeatedly reflected between the first electrode 4 and the second electrode 6 within a prescribed optical length range. Light of a prescribed wavelength corresponding to the optical path length resonates and is intensified, while light of wavelengths not corresponding to the optical path length is weakened. As a result, the spectrum of light extracted to the outside becomes steep and high-intensity, and the luminance and color purity are enhanced.

Alternatively, the same light-emitting material which emits white light may be used for all of the light-emitting areas U of the red sub-pixel 11R, the green sub-pixel 11G, and the blue sub-pixel 11B. In this case as well, as a result of light of different wavelengths depending on each of the sub-pixels 11R, 11G, and 11B resonating and being amplified, red light is emitted from the red sub-pixel 11R, green light is emitted from the green sub-pixel 11G, and blue light is emitted from the blue sub-pixel 11B.

A cap layer 21 is layered onto the upper face of the second electrode 6. The cap layer 21 functions as a protective layer protecting the second electrode 6 and functions as an optical adjustment layer. Note that a color filter may be added at an upper-layer side of the second electrode 6. The color filter transmits light emitted from the organic layer 5, enabling the color purity to be raised.

Figure 5B:
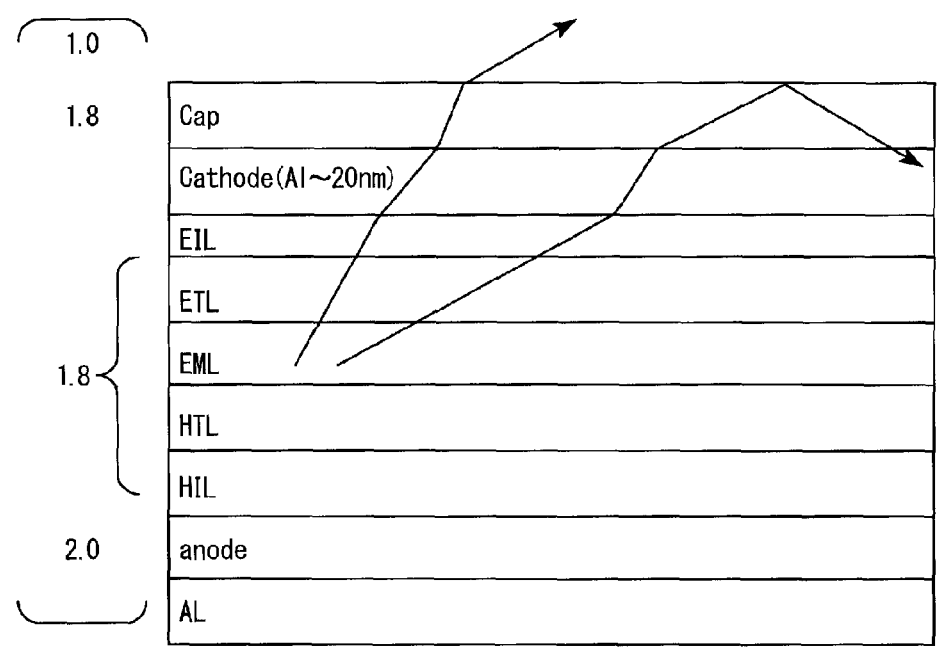
FIG. 5B is a drawing illustrating an example of a specific configuration of an organic EL device.

One example of a specific configuration of the organic EL device 100 is as illustrated in FIG. 5B.

Method for Producing Organic EL Device

A process for producing the organic EL device having the above configuration will be described hereinafter.

FIGS. 6A to 6D illustrate a production process for the organic EL device of the first embodiment.

Figure 7A:
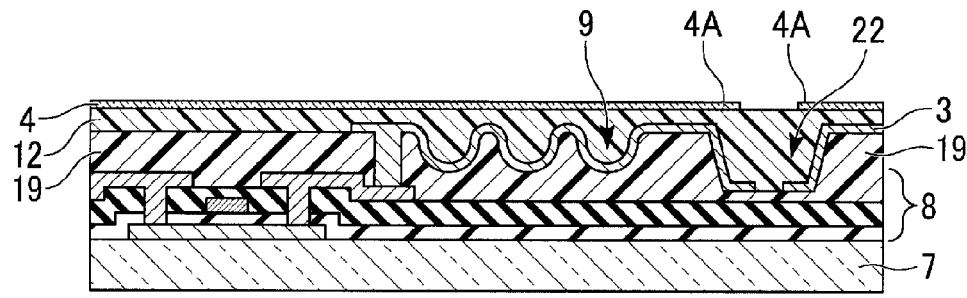
FIG. 7A is a first drawing illustrating the production process of the organic EL device of the first embodiment.
Figure 7B:
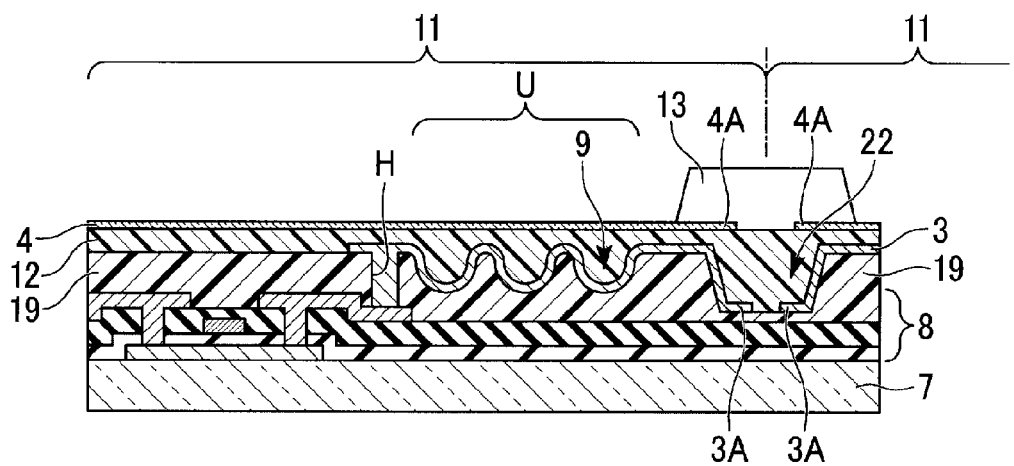
FIG. 7B is a second drawing illustrating the production process of the organic EL device of the first embodiment.
Figure 7C:
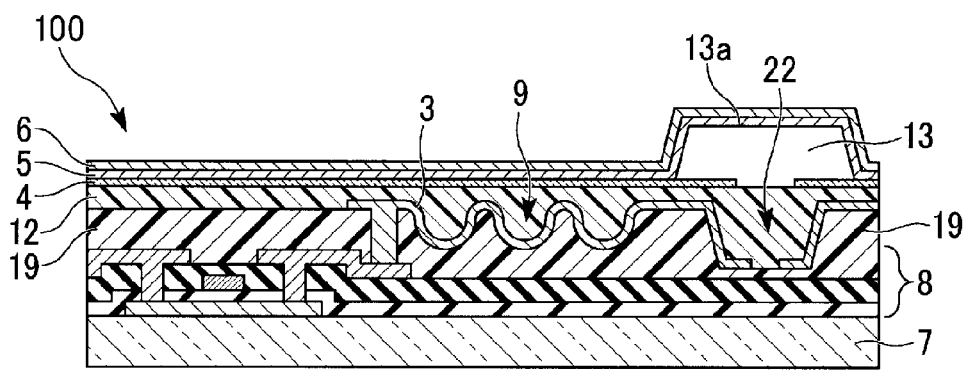
FIG. 7C is a third drawing illustrating the production process of the organic EL device of the first embodiment.

FIGS. 7A to 7C illustrate a production process for the organic EL device of the first embodiment.

Here, FIGS. 6A to 6D and FIGS. 7A to 7C illustrate a cross-section along line B-B' illustrated in FIG. 2.

First, a TFT array substrate 101 is formed.

Figure 6A:
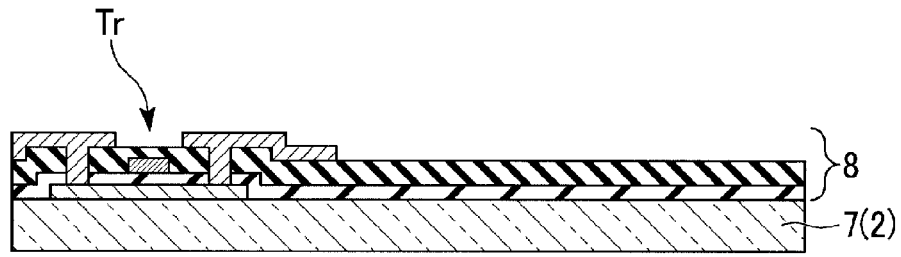
FIG. 6A is a first drawing illustrating the production process of the organic EL device of the first embodiment.

As illustrated in FIG. 6A, a TFT layer 8 including a thin film transistor (active element) Tr or the like is formed on a base material 7. The thin film transistor Tr is formed using a known method and is not particularly limited.

Figure 6B:
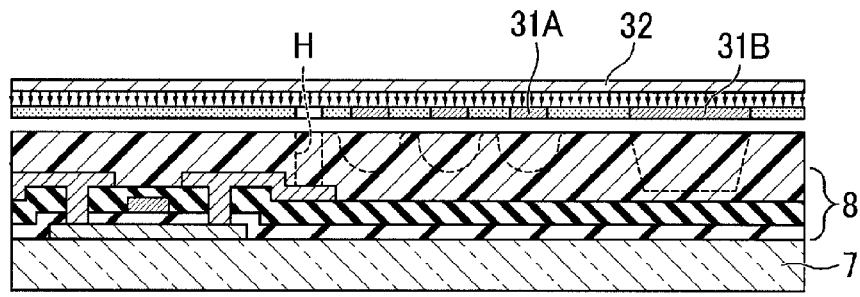
FIG. 6B is a second drawing illustrating the production process of the organic EL device of the first embodiment.

Next, as illustrated in FIG. 6B, silicon nitride is formed as a light-transmissive resin film 24 on the thin film transistor Tr by a known CVD method so that the film thickness is 4 µm. Here, the substrate illustrated in FIG. 6A is immersed for two minutes in an ultrasonic washing tank of purified water, blow-dried with N2, and dried in an atmospheric oven at 150° C. A photosensitive acrylic resin (for example, JAS100, available from JSR) is then applied to the base material 7 by a spin coating method at a revolution speed of 1000 rpm and a revolution time of 10 seconds, and the sample is then pre-baked for two minutes with a hot plate at 150° C.

Next, the photosensitive acrylic resin film 35 is exposed to form a prescribed pattern by using a photomask 31 by using an UV exposure device 32. The exposure time is one second. In this embodiment, a mask in which a pattern having a diameter of 4 µm was arranged at a pitch of 7 µm was used. When completed, the recessed portion structure assumes a pattern with a diameter of approximately 5 µm due to pattern shift, and the excavated structure is exposed to a prescribed pattern with vertical and horizontal dimensions of 78 µm×10 µm. Here, the portion of the photomask 31 corresponding to the recessed portion structure is an opening 31A for half exposure having a transmittance of 15%, and the portion corresponding to the excavated structure is an opening 31B for half exposure having a transmittance of 85%. In addition, the portion of the photomask 31 corresponding to the contact hole H connected to the TFT wiring line is completely opened in the film thickness direction.

Figure 6C:
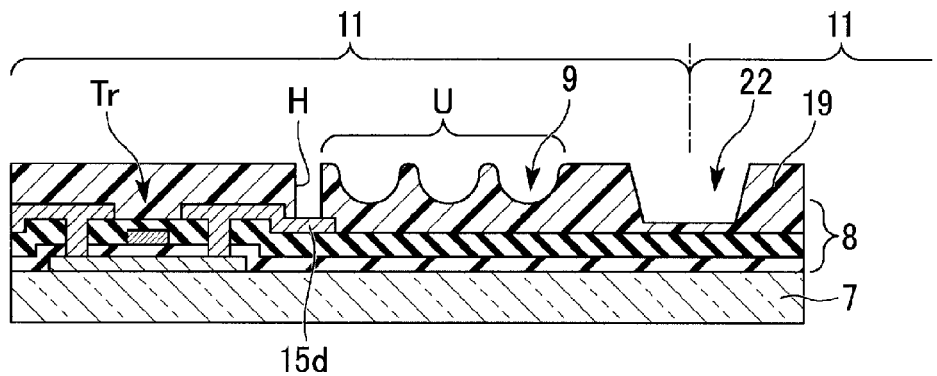
FIG. 6C is a third drawing illustrating the production process of the organic EL device of the first embodiment.

The product is then developed with an alkaline developing solution with a concentration of a few %. Specifically, the product is immersed for two minutes in 0.1% tetraammonium hydroxide (TMAH) and washed with water to obtain a prescribed pattern as illustrated in FIG. 6C. The product is then baked for 60 minutes in an atmospheric oven at 200° C.

In this way, a flattening resin layer 19 including a plurality of recessed portions 9 for each sub-pixel 11 and including excavated portions 22 between the light emission areas U is obtained. A portion of the drain electrode 15d of the thin film transistor Tr is exposed through the contact hole H.

Next, an organic EL element 30 corresponding to the color of each sub-pixel 11 is formed on the flattening resin layer 19.

Figure 6D:
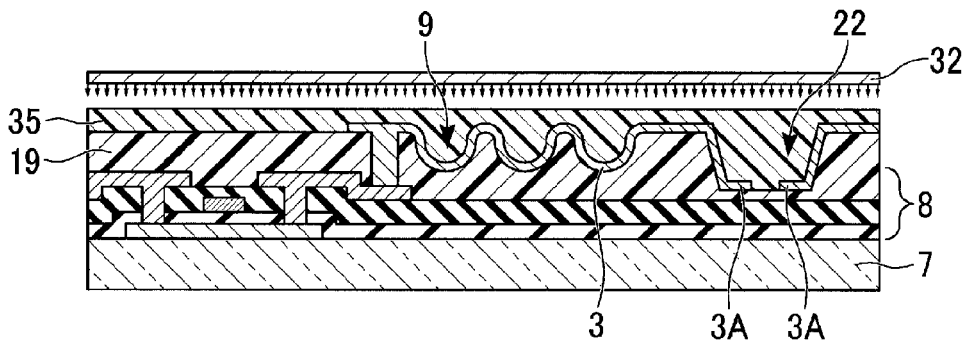
FIG. 6D is a fourth drawing illustrating the production process of the organic EL device of the first embodiment.

First, as illustrated in FIG. 6D, a reflective layer 3 is formed over the plurality of recessed portions 9 formed on the flattening resin layer 19. The reflective layer 3 is obtained by forming a film of aluminum (Al) having a thickness of 100 nm and forming the film into a prescribed pattern with a known method. After the film of Al having a thickness of 100 nm is formed and a photoresist is applied by a known sputtering method, the product is exposed and developed and then etched for two minutes with a phosphoric acid-based etching solution. The resist is then removed with a stripper. As a result, a reflective layer 3 is formed for each sub-pixel 11.

At this time, the end portion 3A of the reflective layer 3 is formed inside the excavated portion 22.

Next, as illustrated in FIG. 6D, a positive-working photosensitive acrylic resin is applied by a spin coating method to the flattening resin layer 19 including the reflective layer 3 to form a photosensitive acrylic resin layer 35.

The acrylic resin is applied to the substrate at a revolution speed of 1500 rpm and a revolution time of 20 seconds and is baked for two minutes with a hot plate at 150° C. In addition, the exposure time is one second. In this embodiment, the entire insides of the plurality of recessed portions 9 are filled with the resin material, and the excess resin material flows into the excavated portions 22. Here, when the film thickness of the photosensitive acrylic resin layer 35 is greater than a prescribed film thickness, UV exposure is performed using a photomask 36.

Note that ashing alone may be used rather than exposure/development. In the case of exposure/development, the surface is fully exposed at a reduced exposure intensity. By reducing the overall exposure intensity, the need for a photomask is eliminated.

When the exposure intensity is not reduced, a half-tone mask without a main pattern is used.

On the other hand, when a prescribed film thickness is achieved, the exposure step may be omitted. The thickness of the photosensitive acrylic resin layer 35 is formed to be 1.0 μm at the point when pre-baking is complete.

After the photosensitive acrylic resin layer 35 is exposed, the photosensitive acrylic resin layer 35 is developed for two minutes with an alkaline developing solution having a concentration of a few %, washed with water, and dried, and the entire base material 7 is then baked in an oven at 200° C. More specifically, the baked product is immersed for two minutes in 0.1% tetraammonium hydroxide (TMAH), developed into a pattern, and washed with water, and the substrate is then blow-dried with N2 and baked in an oven at 200° C. Thus, a filling layer 12 is formed on the substrate including a plurality of recessed portions 9 and excavated portions 22 provided for each sub-pixel 11, resulting in the configuration illustrated in FIG. 7A.

Next, as illustrated in FIG. 7A, an Indium Zinc Oxide (IZO) film is formed as a first electrode 4 made of a transparent electrode on the entire surface of the substrate to cover the reflective layer 3 with a thickness of 120 nm. That is, an IZO film is formed with a thickness of 100 nm by a known sputtering method. The photosensitive photoresist is then applied by a spin coating method, pre-baking is complete. Pattern exposure is then performed using a photomask with a prescribed pattern and an UV exposure device, and after the photoresist is developed, etching is performed for 2 to 4 minutes with oxalic acid. The photoresist is then removed with a stripper, washed with water, and dried. In this embodiment, the product is patterned such that the end portion 4A of the first electrode 4 is located over the excavated portion 22. The end portion 4A faces the end portions 4A of the first electrodes 4 of adjacent sub-pixels 11 at a prescribed distance over the excavated portions 22.

The reflective layer 3 and the first electrode 4 are electrically connected to a drive circuit system such as TFT wiring line through the contact hole H outside the light emission area U. This allows each sub-pixel 11 to emit light in a prescribed manner.

Next, an acrylic resin film is formed on the filling layer 12 as an edge cover layer 13 covering the end portions 4A of the first electrode 4. That is, a film of an acrylic resin is formed by a spin coating method so that the thickness is 2 μm at the point when pre-baking is complete. This resin film is subjected to pattern exposure with a photomask having a prescribed pattern and an UV exposure device and is then developed with an alkaline developing solution having a concentration of a few %. After the film is then washed with water and dried, the film is baked for 1 hour in an oven at 200° C. As a result, an edge cover layer 13 such as that illustrated in FIG. 7B is formed. At this time, the edge cover layer 13 is formed and patterned to simultaneously cover the end portions 4A of two first electrodes 4 of adjacent sub-pixels 11 positioned over the excavated portions 22.

In this embodiment, the light emission area U is defined by the edge cover layer 13.

Next, as illustrated in FIG. 7C, an organic layer 5 is formed with a configuration such as that illustrated in FIG. 5B. Here, a sub-pixel 11 corresponding to each color of red (R), green (G), and blue (B) is formed by a publicly known selectively patterning vapor deposition method, and R, G, and B are combined to form one pixel.

Finally, a vapor deposition film made of magnesium silver (MgAg) having a film thickness of 1 nm and silver (Ag) having a film thickness of 19 nm is formed on the upper face 13a of the edge cover layer 13 to cover the organic layer 5 formed for each sub-pixel 11, thus forming a second electrode 6. In this way, a plurality of organic EL elements 30 are formed for each sub-pixel 11.

The organic EL device 100 of the present embodiment is completed by the process above.

To verify the effect of the excavated structure of this embodiment, the present inventors produced two types of organic EL elements and compared the film thicknesses of the applied films during the formation of the filling layer.

The example includes an excavated structure, and the comparative example does not include an excavated structure.

Figure 8B:
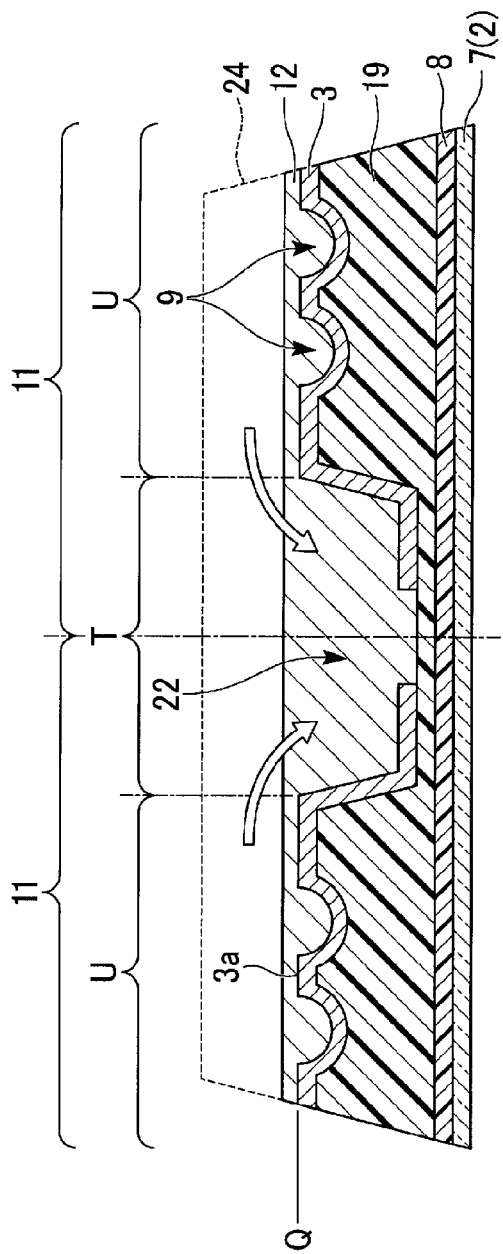
FIG. 8B is a cross-sectional view illustrating an organic EL element of an example in which a recessed portion structure is provided in a light emission area and an excavated structure is provided in a non-emitting area.

FIG. 8A is a cross-sectional view illustrating an organic EL element of a comparative example provided with a recessed portion structure in a light emission area. FIG. 8B is a cross-sectional view illustrating an organic EL element of an example in which a recessed portion structure is provided in a light emission area and an excavated structure is provided in a non-emitting area.

As illustrated in FIG. 8A, when forming a recessed portion structure (light extraction structure) in the organic EL element of the comparative example, a reflective layer 3 is formed in the recessed portion 9, and the reflective layer 3 in the recessed portion 9 is filled with a light-transmissive resin material to obtain a filling layer 12. At this time, any light-transmissive resin material overflowing from the recessed portion 9 accumulates on the flattening resin layer 19 including the reflective layer 3, resulting in a thick light-transmissive resin film 24. In addition, the film is formed not only in the light emission area U, but also in the non-emitting area T serving as a boundary portion between adjacent sub-pixels.

Therefore, in this embodiment, as illustrated in FIG. 8B, the film thickness is first reduced by fully exposing/developing the region of the light-transmissive resin film 24 corresponding to the non-emitting area T to form an excavated structure.

Specifically, in the example, the excavated portion 22 is formed in advance on the flattening resin layer 19 between the light emission areas U of the boundary portions of adjacent sub-pixels 11. As a result, in the filling layer formation step, the light-transmissive resin material overflowing from the recessed portions 9 at the time of the application of the light-transmissive resin material can be channeled into the excavated portion 22, and the film thickness of the light-transmissive resin film 24 formed on the plane Q can be suppressed. Thus, the height of excess resin remaining after cutting down the film thickness of the light-transmissive resin film 24 can be reduced in a subsequent step.

As a result, the step of exposing/developing the resin film can be eliminated, and the production processes can be dramatically reduced. In addition, the variation in the film thickness distribution of the light-transmissive resin material can be reduced.

Further, even when the light-transmissive resin film 24 is required to be fully exposed/developed, the amount of cutting may be small, which shortens the exposure time and enables a reduction in production time.

Note that when an excessive film thickness arises, the step of cutting down the resin film may also be performed by ashing alone rather than exposure/development.

The film thickness of the light-transmissive resin film in the structure of the comparative example and the film thickness of the light-transmissive resin film in the structure of the example are respectively illustrated in Table 1. Here, the film thickness of the light-transmissive resin film is the thickness between the upper face of the light-transmissive resin film and the plane Q including the upper face 3a of the reflective layer 3.

TABLE 1

|  | Light-transmissive resin thickness |
| --- | --- |
| Comparative example (without excavated portion) | 3 μm |
| Example (with excavated portion) | 1 μm |

As illustrated in Table 1, whereas the film thickness of the light-transmissive resin film is as great as 3 μm in the structure of the comparative example, the film thickness is 1 μm in the structure of the example, which is ⅓ that of the comparative example.

As described above, with the configuration of this embodiment, carving out the flattening resin layer 19 positioned between sub-pixels 11 in advance allows the light-transmissive resin material to flow into the excavated portion 22 in the filling layer formation step. This reduces the film thickness of the light-transmissive resin film 24 in the light emission area U. As a result, the amount that the light-transmissive resin film 24 is cut down can be reduced, and the exposure time for grinding down the film can be shortened. Therefore, variation in the film thickness (formation) of the filling layer 12 can be suppressed. In addition, reduction in the amount of resin applied leads to a reduction in cost.

Further, when it is unnecessary to cut down the light-transmissive resin film 24, the process itself can be eliminated. Thus, an organic EL device 100 having a high light emitting efficiency and low power consumption can be obtained efficiently.

Second Embodiment

Next, an organic EL device of a second embodiment of the disclosure will be described.

The basic structure of the organic EL device of this embodiment described below is substantially the same as that of the first embodiment described above, but differs in the configuration of the organic EL element. Therefore, in the following description, the portions different from the previous embodiment will be described in detail, and the description of parts in common will be omitted. In addition, in each of the drawings used in the description, components that are common to FIGS. 1 to 5 are labeled with the same symbols.

Figure 9:
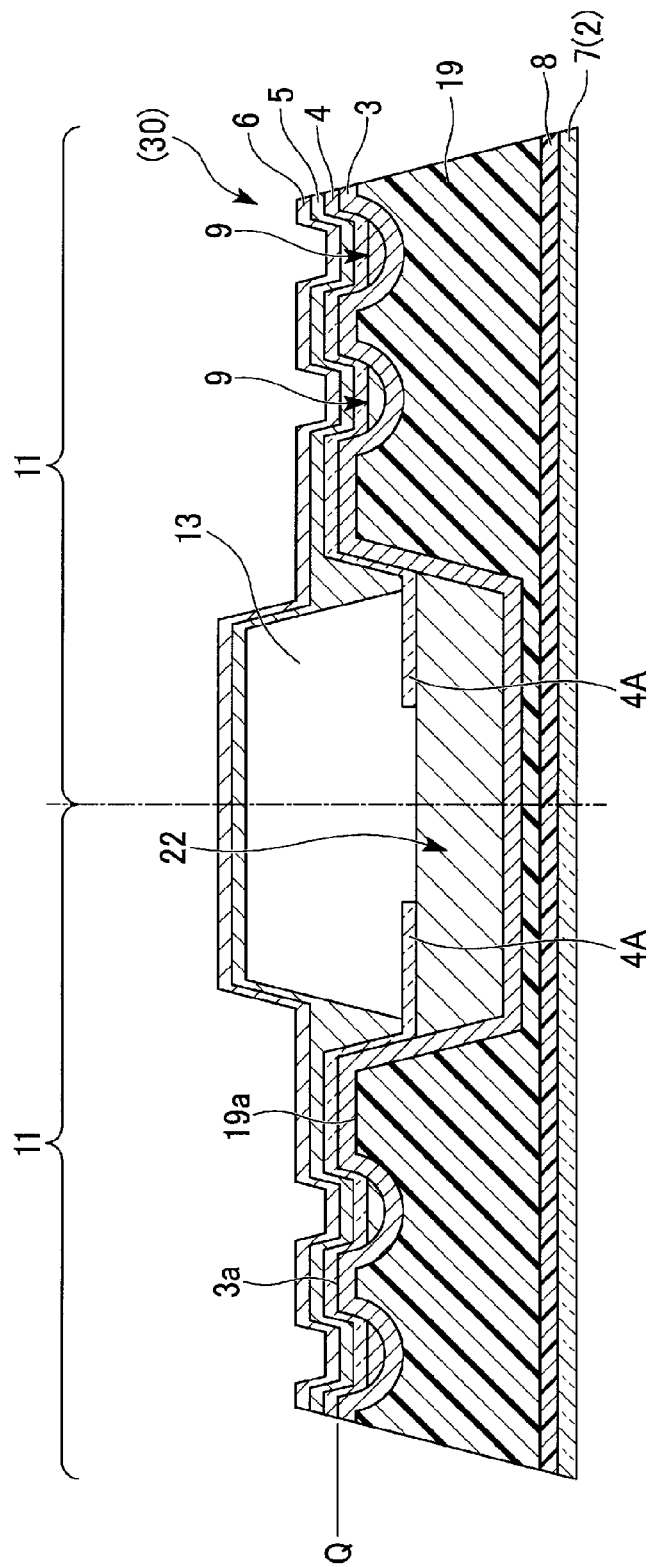
FIG. 9 is a cross-sectional view partially illustrating a structure between sub-pixels in the organic EL device of a second embodiment.
Figure 10:
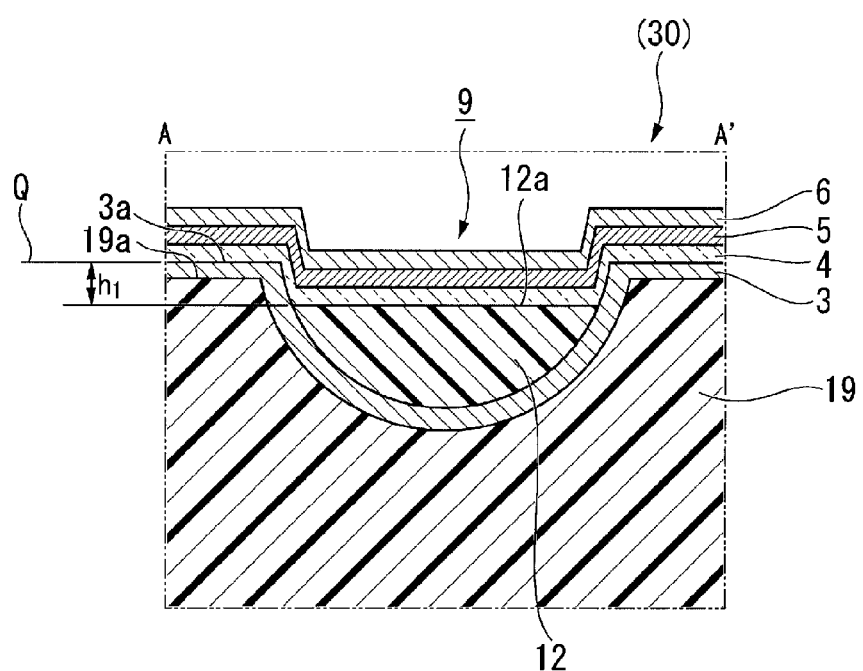
FIG. 10 is a partially magnified partial cross-sectional view illustrating a recessed portion structure in the organic EL device of the second embodiment.
Figure 11:
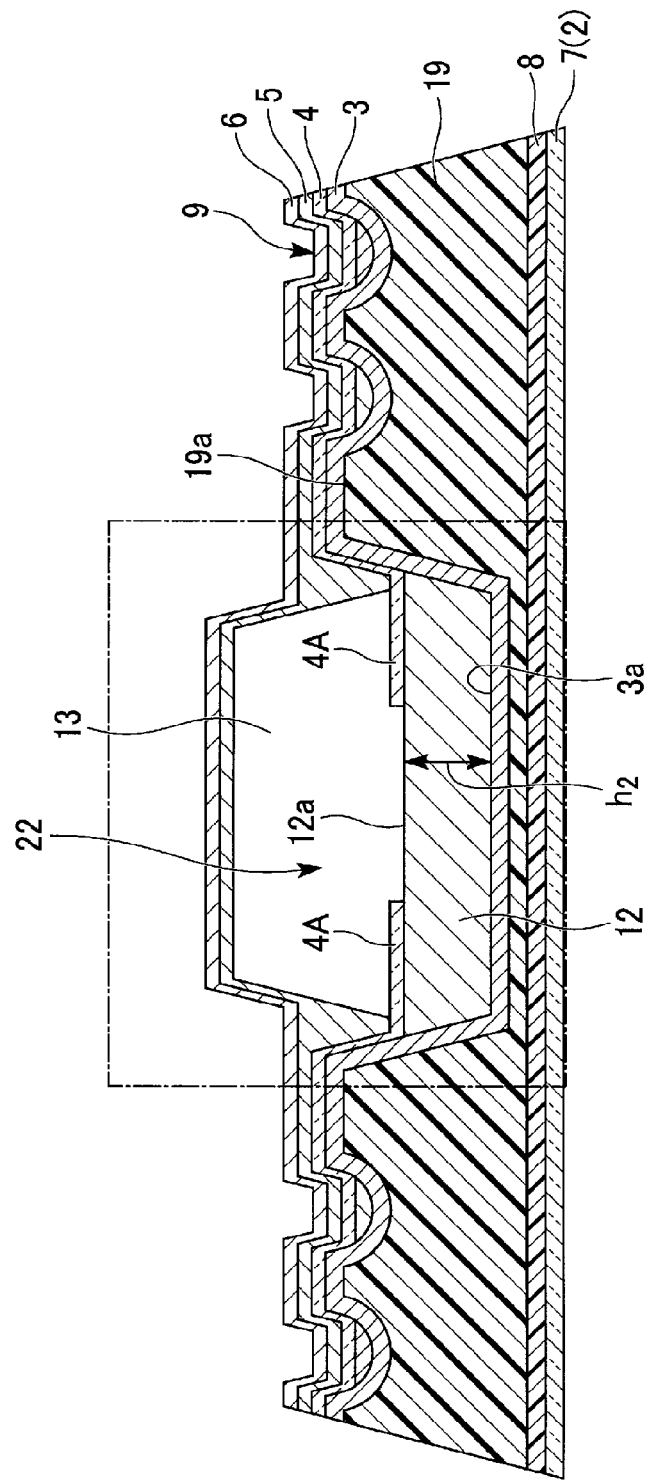
FIG. 11 is a partially magnified partial cross-sectional view illustrating an excavated structure in the organic EL device of the second embodiment.

FIG. 9 is a cross-sectional view partially illustrating a structure between sub-pixels in the organic EL device of a second embodiment. FIG. 10 is a cross-sectional view partially illustrating a structure between sub-pixels in the organic EL device of the second embodiment. FIG. 11 is a partially magnified partial cross-sectional view illustrating an excavated structure in the organic EL device of the second embodiment.

In the organic EL device of this embodiment, as illustrated in FIG. 10, the upper face 12a of the filling layer 12 provided on the recessed portion 9 and the excavated portion 22 is positioned lower than the plane Q including the reflective layer 3. That is, the lower face of the first electrode 4 is in contact with the upper face 12a of the filling layer 12 at a position inside the recessed portion 9 and the excavated portion 22.

In the case of such a configuration, as illustrated in FIG. 10, the height $h_1$ from the upper face 12a of the filling layer 12 inside the recessed portion 9 to the upper face 3a of the reflective layer 3 is set to 0.1 μm, for example. On the other hand, as illustrated in FIG. 11, the height $h_2$ from the upper face 12a of the filling layer 12 inside the excavated portion 22 to the upper face 3a of the reflective layer 3 is set to 1 μm, for example.

The first electrode 4 is formed across the upper face 12a of the filling layer 12 and the upper face 3a of the reflective layer 3 and has a level difference at the respective edges of the recessed portion 9 and the excavated portion 22. The reflective layer 3 and the first electrode 4 formed in each recessed portion 9 are electrically connected to one another at an overlapping portion on the upper face 19a of the flattening resin layer 19.

An edge cover layer 13 is formed inside the excavated portion 22 to simultaneously cover the end portion 3A of each reflective layer 3 in each of the adjacent sub-pixels 11 and the end portion 4A of each first electrode 4 overlapping with the end portion 3A of the reflective layer 3 in a plan view.

Method for Producing Organic EL Device

Figure 12A:
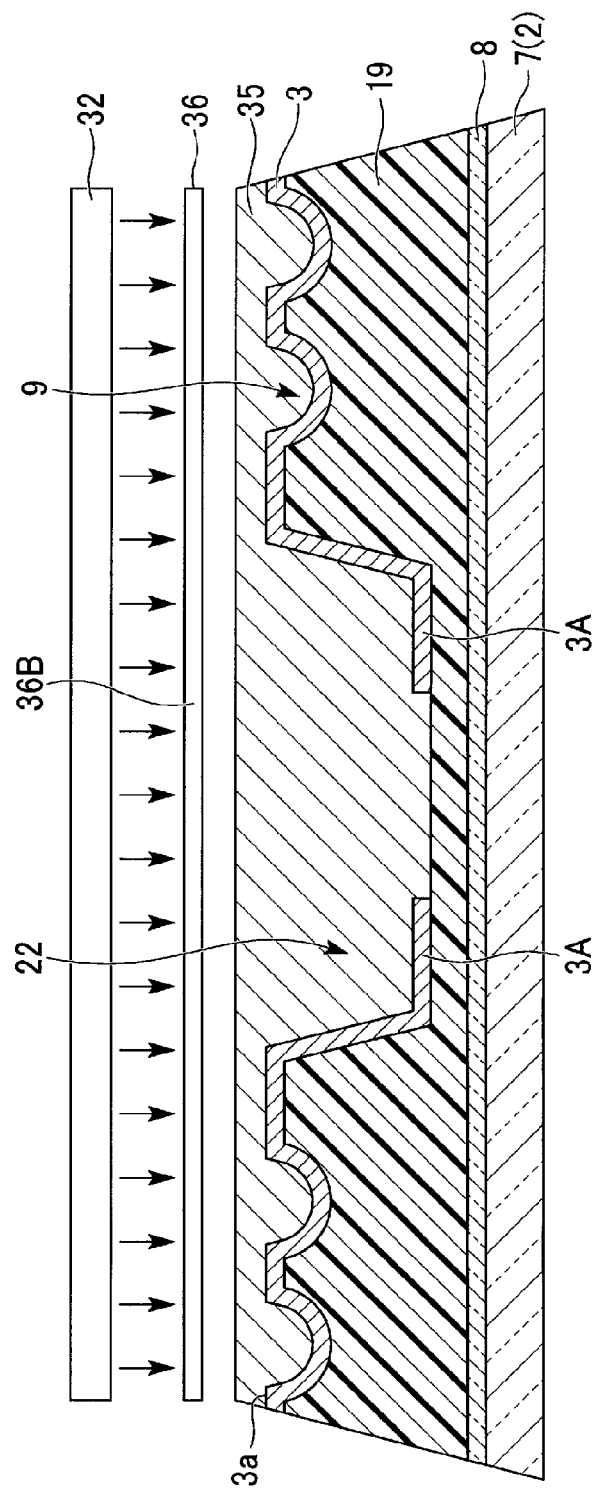
FIG. 12A is a first drawing illustrating a portion (filling layer formation) of a production method in the second embodiment.
Figure 12B:
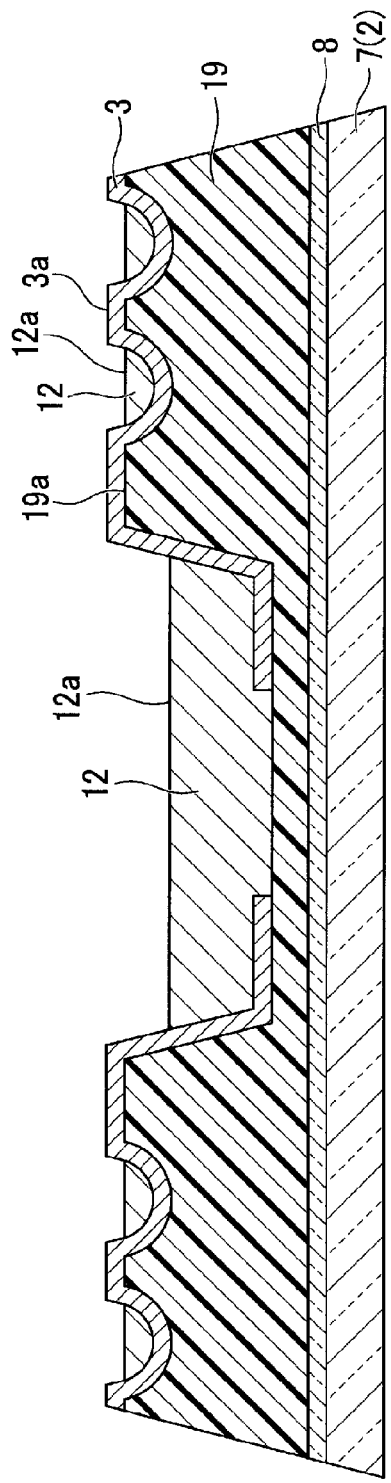
FIG. 12B is a second drawing illustrating a portion (filling layer formation) of the production method in the second embodiment.

FIGS. 12A and 12B are drawings illustrating a portion (filling layer formation) of the production method in the second embodiment. FIG. 12A illustrates the exposure/development step, and FIG. 12B illustrates the state after processing.

First, as in the first embodiment, a TFT layer (not illustrated), a flattening resin layer 19, and a reflective layer 3 are formed on a base material (not illustrated), and a positive-working photosensitive acrylic resin material is applied by a spin coating method to the upper face 3a of the reflective layer 3. At this time, the resin material flows not only into the recessed portion 9, but also into the excavated portion 22, and the photosensitive acrylic resin layer 35, which is a coating film, can be therefore made thin (FIG. 12A). The layer is then fully exposed and developed using an UV exposure device 32. The photosensitive acrylic resin layer 35 is further subjected to ashing. Note that exposure/developing may be omitted, and ashing alone may be performed.

Thus, as illustrated in FIG. 12B, the film thickness was reduced until the upper face 3a of the reflective layer 3 was exposed. Specifically, in this embodiment, the upper face 12a of the filling layer 12 in the recessed portion 9 and the upper face 12a of the filling layer 12 in the excavated portion 22 are at the same level or lower than the upper face 19a of the flattening resin layer 19.

Note that the photomask 36 used at this time is such that the recessed portion structure pattern is greater than the contact hole pattern. Specifically, the recessed portion structure pattern is approximately from 1 to 2 µm greater in total circumference and from 2 to 4 µm greater in diameter than the contact hole pattern. The photomask is designed taking into consideration the wraparound of light at the time of exposure.

After the filling layer 12 is formed inside the plurality of recessed portions 9 and excavated portions 22, a first electrode 4 made of Indium Zinc Oxide (IZO) is formed on the reflective layer 3 including each upper face 12a thereof.

The subsequent steps are the same as those of the first embodiment, and descriptions thereof will be omitted.

With this embodiment, the film thickness arising at the time of the application of the photosensitive acrylic resin can be reduced by the excavated portion 22. In addition, in this embodiment, the photosensitive acrylic resin layer 35 is further cut down by ashing so that the upper face 12a of the filling layer 12 inside the recessed portion 9 and the excavated portion 22 is lower than the plane Q including the reflective layer 3. This allows the first electrode 4 and the reflective layer 3 to be electrically connected to one another at the overlapping portion on the upper face 19a of the flattening resin layer 19.

Further, by reducing the film thickness of the photosensitive acrylic resin, the luminescent components can be reflected by the inclined portion of the reflective layer 3 along the wall surface of the recessed portion 9 and extracted to the display surface side, which enhances the light extraction effect.

To verify the effect of the organic EL element of this embodiment, the present inventors produced two types of organic EL elements and compared the luminance enhancing effect of each element.

Figure 13A:
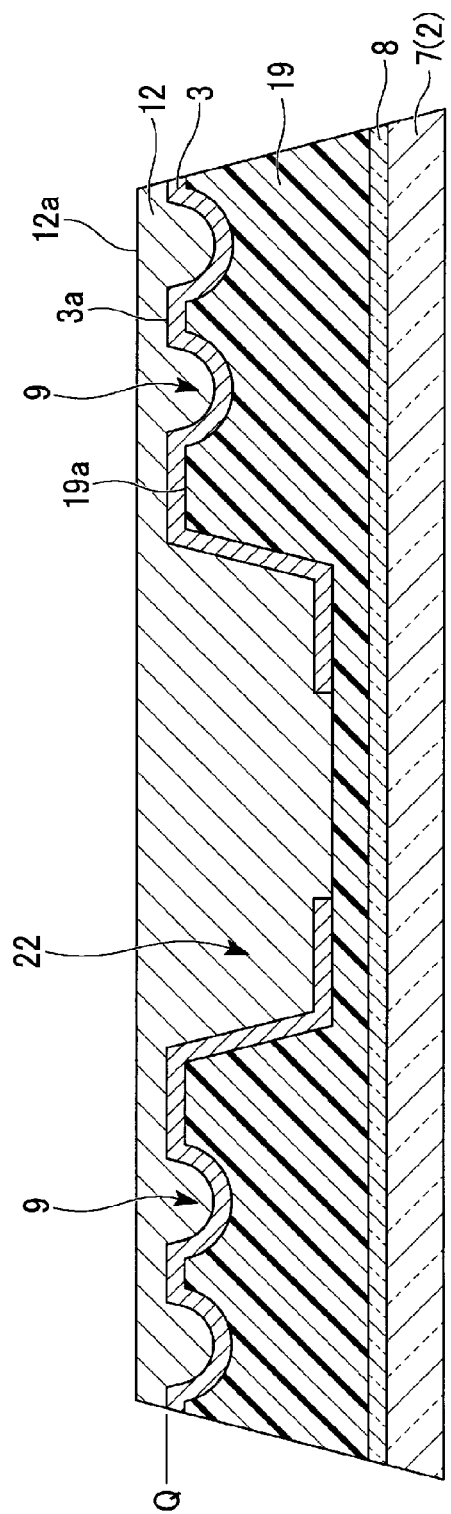
FIG. 13A is a drawing illustrating the configuration of an example.
Figure 13B:
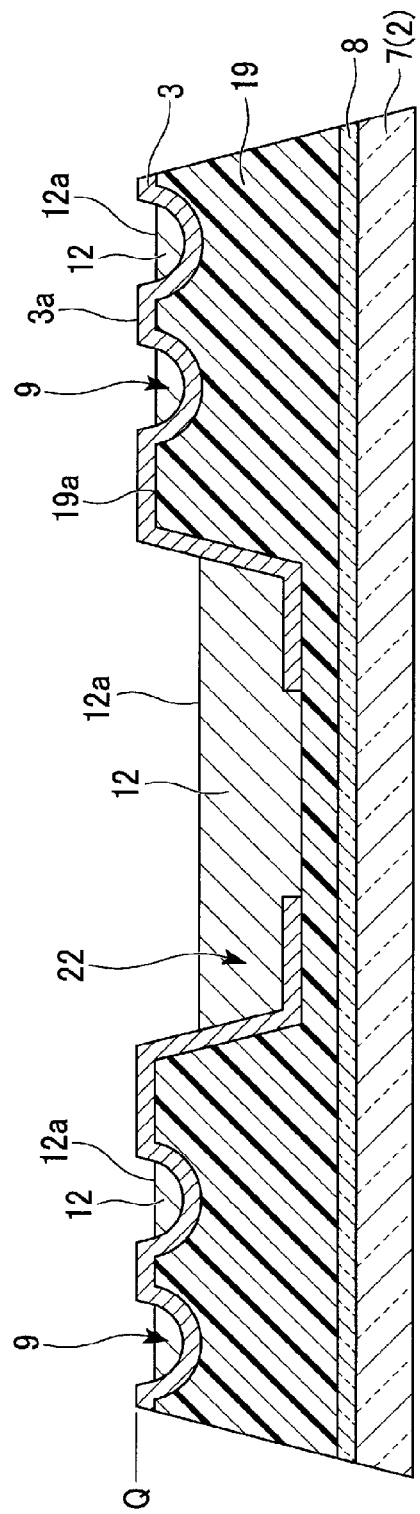
FIG. 13B is a drawing illustrating the configuration of a comparative example.

FIG. 13A is a drawing illustrating the configuration of an example, and FIG. 13B is a drawing illustrating the configuration of a comparative example.

The example illustrated in FIG. 13A has a structure in which the upper face 12a of the filling layer 12 is lower than the plane Q at the position of the recessed portions 9 and the excavated portion 22 (organic EL element of the second embodiment).

The comparative example illustrated in FIG. 13B has a structure in which the upper face 12a of the filling layer 12 coincides with each position of the recessed portions 9 and the excavated portion 22 (organic EL element of the first embodiment).

The luminance enhancement rate of each of these elements at a fixed current value (10 mA/m$^2$) is shown in Table 2.

TABLE 2

|  | Comparative Example | Example |
| --- | --- | --- |
| Light extraction efficiency | 1.0 | 1.4 |

As shown in Table 2, when the light extraction efficiency of the organic EL element of the comparative example was used as a reference, the light extraction efficiency of the organic EL element of the example was approximately 1.4 times higher than that of the comparative example.

The organic EL element of the example can extract luminescent components upward by means of reflection by the inclined portion of the reflective electrode inside the recessed portion. This further enhances the light extraction efficiency.

In addition, in the example, the edge cover layer 13 is formed inside the excavated portion 22. Therefore, the film thickness of the organic layer 5 becomes low at the portion with a level difference relative to the excavated portion 22, which provides the effect of enabling the reduction of display defects due to crosstalk in a high-precision display panel such as a white light emitting element.

Third Embodiment

Next, an organic EL device of a third embodiment of the disclosure will be described.

The basic structure of the organic EL device of this embodiment described below is substantially the same as that of the first embodiment described above, but differs with regard to the excavated structure. Therefore, in the following description, the portions different from the previous embodiment will be described in detail, and the description of parts in common will be omitted. In addition, in each of the drawings used in the description, components that are common to FIGS. 1 to 5A are labeled with the same symbols.

Figure 14:
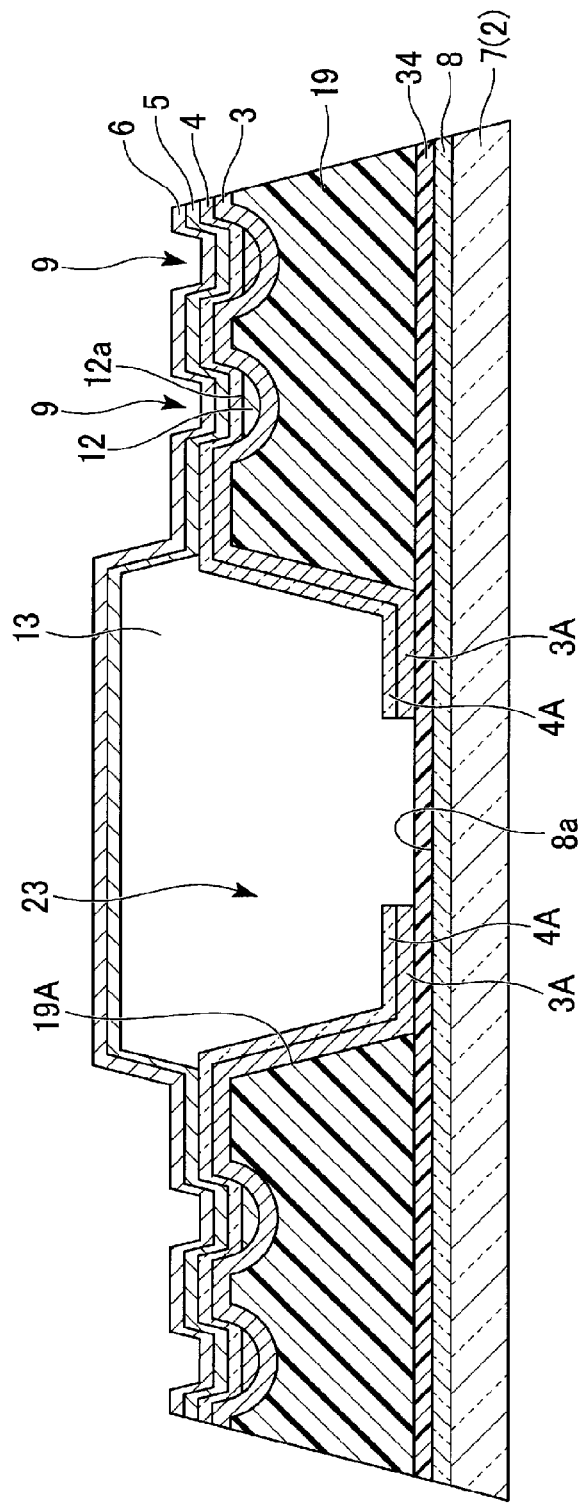
FIG. 14 is a cross-sectional view partially illustrating a structure between sub-pixels in the organic EL device of a third embodiment.
Figure 15:
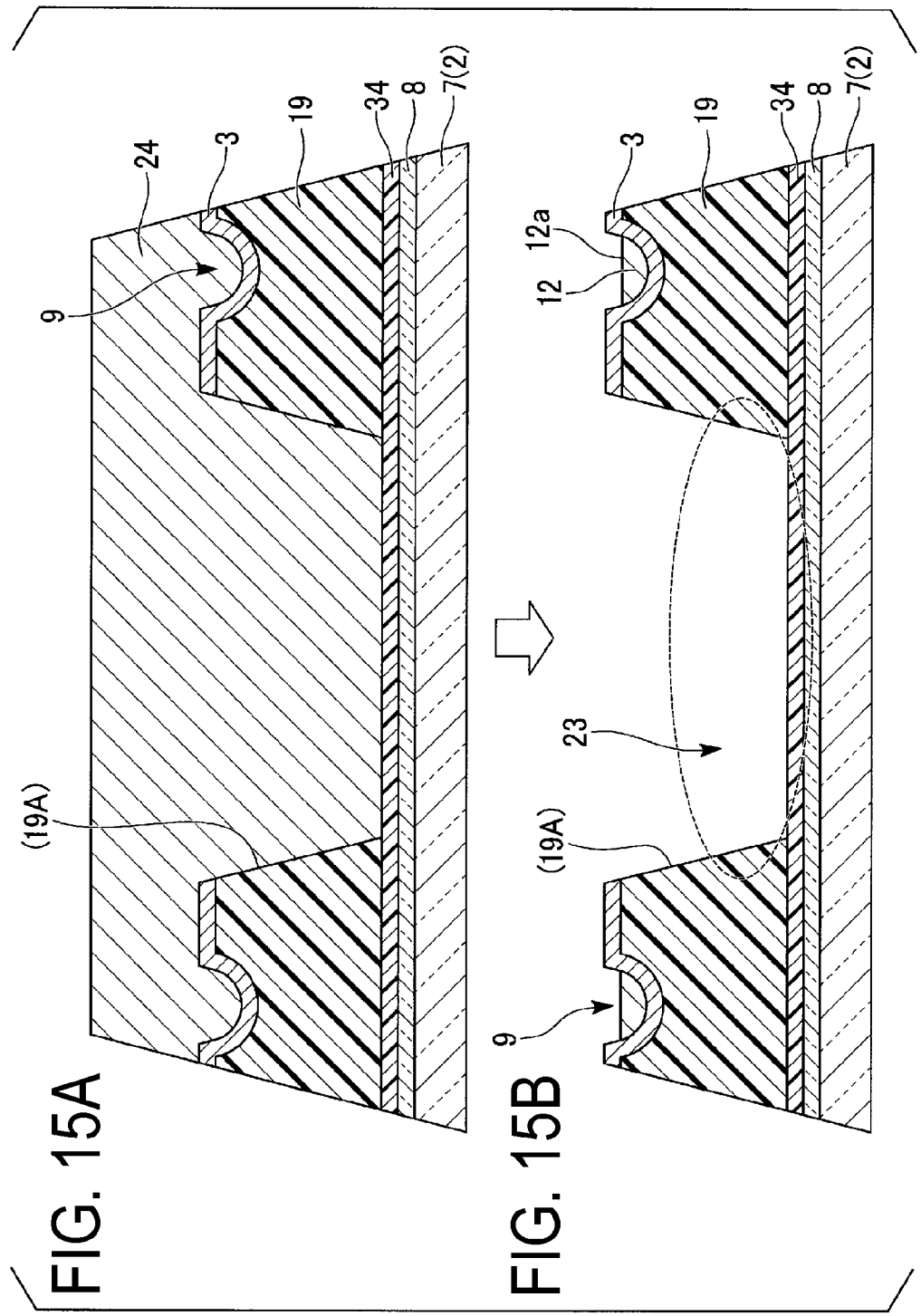
FIGS. 15A and 15B are drawings for describing a production method of the excavated structure.

FIG. 14 is a cross-sectional view partially illustrating a structure between sub-pixels in the organic EL device of a third embodiment. FIGS. 15A and 15B are drawings for describing the production method of the excavated structure.

In the organic EL device of this embodiment, as illustrated in FIG. 14, a reflective layer 3, a first electrode 4 (end portion 4A), and an edge cover layer 13 are provided inside an excavated portion 23, and no filling layer 12 is present. That is, the excavated portion 23 of the flattening resin layer 19 of this embodiment is formed from a through-hole (first through-hole) 19A passing through in the film thickness direction. The through-hole 19A can be obtained by using a mask pattern for performing full exposure on the region corresponding to the excavated portion 23 (FIG. 15B) of the light-transmissive resin film 24 illustrated in FIG. 15A.

The reflective layer 3 is formed on the upper face 8a of a TFT layer 8 corresponding to the through-hole 19A. Therefore, in this embodiment, an insulating resin film (insulating film) 34 is formed between the TFT layer 8 and the reflective layer 3 to prevent shorting between the reflective layer 3 and the electrode wiring line of a thin film transistor Tr. A layered film made of an SiO$_2$ film and an SiNx film is used as the insulating resin film 34.

The edge cover layer 13 is formed with a greater width than in the second embodiment to cover not only the end portion 4A of the first electrode 4 positioned on the excavated portion 23, but also the inclined portion along the wall surface of the recessed portion 9. Note that the edge cover layer 13 is not limited to this configuration, and the edge cover layer 13 may also be formed with a size allowing the layer to cover only the end portion 4A, as in the case of the edge cover layer 13 of the second embodiment.

With the configuration of this embodiment, forming the excavated portion 23 in the entire film thickness direction of the flattening resin layer 19 enables an excavated structure with depth. Therefore, a larger amount of the resin material applied at the time of the formation of the filling layer 12 can be received, and the film thickness of the coated film on the plane Q can be further reduced.

To verify the effect of the excavated structure of this embodiment, the present inventors formed two types of organic EL elements and compared the film thicknesses of the applied films during the formation of the filling layer. The results are listed in Table 3.

An example has a structure in which the excavated portion includes a through-hole (organic EL element of the third embodiment).

A comparative example has a structure in which the excavated portion includes a bottomed recessed portion (organic EL element of the second embodiment).

TABLE 3

|  | Light-transmissive resin thickness |
|---|---|
| Comparative Example (residual insulating resin layer) | 1 μm |
| Example (no insulating resin layer) | 0.5 μm |

As illustrated in Table 3, whereas the film thickness of the light-transmissive resin film is 1 μm in the configuration of the comparative example, the film thickness is 0.5 μm in the structure of the example, which is half the thickness of the comparative example.

As described above, with the configuration of this embodiment, since the amount that the light-transmissive resin film is cut down can be further reduced, the exposure time in the filling layer forming step can be further shortened.

Alternatively, the production processes can also be reduced as the exposure process becomes unnecessary, for example.

Fourth Embodiment

Next, a fourth embodiment of the disclosure will be described using an organic EL device.

The basic structure of the organic EL device of this embodiment described below is substantially the same as that of the third embodiment described above, but differs in the excavated structure. Therefore, in the following description, the portions different from the previous embodiment will be described in detail, and the description of parts in common will be omitted. In addition, in each of the drawings used in the description, components that are common to FIG. 14 are labeled with the same symbols.

Figure 16:
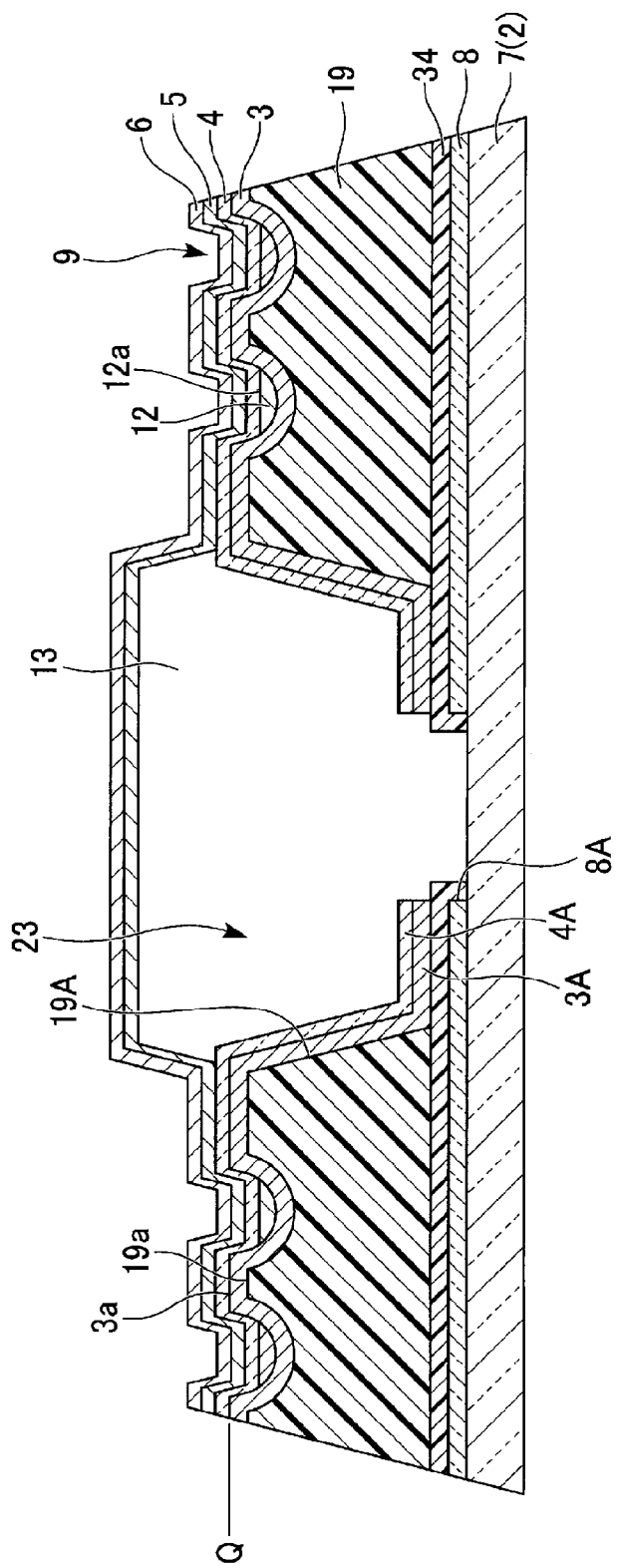
FIG. 16 is a cross-sectional view partially illustrating a structure between sub-pixels in the organic EL device of a fourth embodiment.

FIG. 16 is a cross-sectional view partially illustrating a structure between sub-pixels in the organic EL device of a fourth embodiment.

As illustrated in FIG. 16, in the organic EL device of this embodiment, a through-hole (second through-hole) 8A is formed in a TFT layer 8 positioned on an excavated portion 23. Since the inner peripheral wall of the through-hole 8A is covered with an insulating resin film 34 layered on the TFT layer 8, shorting between the reflective layer 3 and the electrode wiring line of a thin film transistor is prevented. The thickness of the TFT layer 8 is 1 μm, and the thickness of the insulating resin film 34 is also 1 μm.

The TFT layer 8 has a large film thickness to reduce the wiring line resistance of the thin film transistor, and using this thickness as a level difference enables an increase in the capacity of the excavated portion 23. That is, by using a configuration in which the through-hole 8A formed in the TFT layer 8 is included in a portion of the excavated portion 23, the amount of the resin material that flows into the excavated portion 23 can be increased at the time of the formation of the filling layer. As a result, the amount that the coating film is cut down is further reduced, and the processes can be further reduced.

In addition, in the configuration of this embodiment, a portion of the edge cover layer 13 is formed with a size allowing it to rise above the plane Q, but it may also be formed with a thickness allowing the entire width direction of the edge cover layer to fit inside the excavated portion 23, as in the case of the second embodiment.

Figure 17:
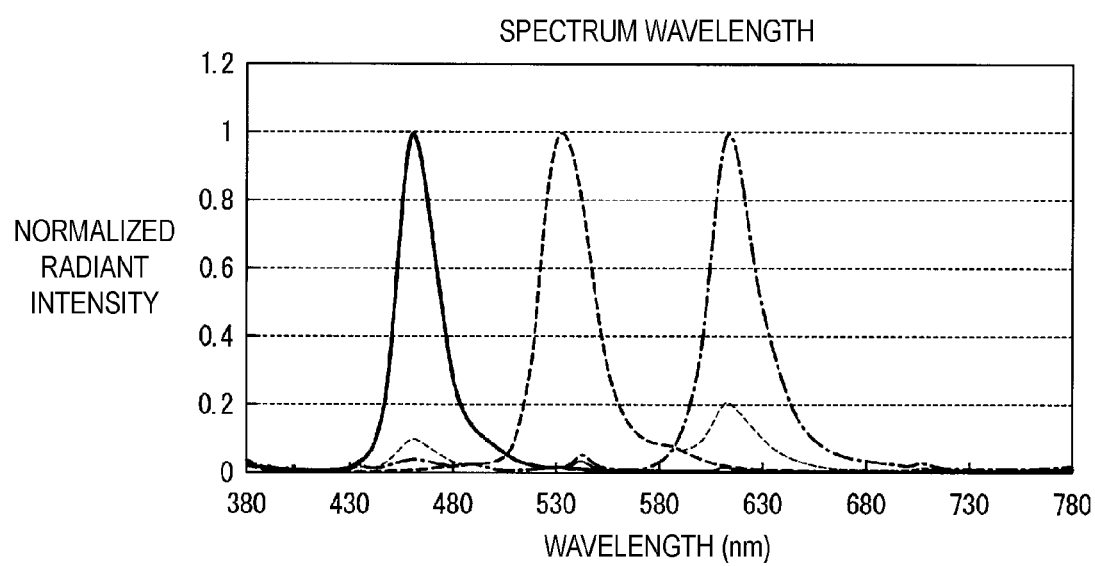
FIG. 17 is a graph showing the light emission spectrum of the organic EL device of the fourth embodiment.

FIG. 17 is a graph showing the light emission spectrum of the organic EL device of the fourth embodiment.

Here, a light emission spectrum of this embodiment in which the through-hole 8A is formed in the TFT layer 8 is indicated by the solid line, and the light emission spectrum of the third embodiment in which the through-hole 8A is not formed in the TFT layer 8 is indicated by the dashed line.

As illustrated in FIG. 17, in the display of any of the colors of RGB, no low-lit defect (crosstalk) arises between sub-pixels, and spectra at wavelengths that should not be present originally are eliminated.

As a result, an organic EL device with high display quality is obtained.

Preferred embodiments of the disclosure were described above with reference to the attached drawings, but it goes without saying that the disclosure is not limited to these examples. It will be clear to a person skilled in the art that various modifications and amendments can be imagined within the scope of the technical ideas described in the Scope of the Patent Claims, and it is understood that these modifications and amendments also obviously fall under the technical scope of the disclosure.

INDUSTRIAL APPLICABILITY

Several aspects of the disclosure can be applied to an organic electroluminescence device, a method for producing an organic electroluminescence device, an illumination device, and a display device capable of shortening the production process and requiring the enhancement of light extraction efficiency.

REFERENCE SIGNS LIST

3 Reflective layer
3a, 8a, 12a, 13a, 19a Upper face
3A, 4A End portion
4 First electrode
5 Organic layer
6 Second electrode
7 Base material
8A, 19A Through-hole
9 Recessed portion
11 Unit light emitting region
12 Filling layer
13 Edge cover layer
16 Light-emitting layer
19 Flattening resin layer (insulating layer)
22, 23 Excavated portion
30 Organic EL element (light-emitting element)
34 Insulating resin film (insulating film)
Q Plane
Tr Thin film transistor (active element

The invention claimed is:
1. An organic electroluminescence device comprising:
a base material;
an insulating layer provided on the base material and provided with a first recessed portion and a second recessed portion on an upper face of the insulating layer;
a first reflective layer provided on at least a surface of the first recessed portion;
a second reflective layer provided on at least a surface of the second recessed portion;

a filling layer having optical transparency and filling an inside of the first recessed portion and the second recessed portion via the first reflective layer and the second reflective layer;

a first electrode and a second electrode having optical transparency and provided on at least an upper layer side of the filling layer;

an organic layer containing at least a light-emitting layer provided on an upper layer of the first electrode and the second electrode;

a third electrode having optical transparency and provided on an upper layer side of the organic layer;

an edge cover layer covering at least a first end portion of the first electrode and a second end portion of the second electrode;

a first unit light emitting region and a second unit light emitting region that are separated from one another and adjacent to each other; and an excavated portion in the insulating layer between the first unit light emitting region and the second unit light emitting region, wherein the first unit light emitting region includes the base material, the insulating layer, the first reflective layer, the filling layer, the first electrode, the organic layer, the third electrode, and the edge cover layer, the second unit light emitting region includes the base material, the insulating layer, the second reflective layer, the filling layer, the second electrode, the organic layer, the third electrode, and the edge cover layer, at least the filling layer is provided inside the excavated portion, the first reflective layer and the second reflective layer are provided on an inside of the excavated portion, and extend along a base of the excavated portion, and a portion of the filling layer is exposed from between the first electrode and the second electrode.

2. The organic electroluminescence device according to claim 1, wherein an upper face of the filling layer at a position of the first recessed portion is positioned above a plane including an upper face of the first reflective layer.

3. The organic electroluminescence device according to claim 1, wherein an upper face of the filling layer at a position of the first recessed portion is positioned below a plane including an upper face of the first reflective layer.

4. The organic electroluminescence device according to claim 1, wherein the base material is exposed via a first through-hole defined in the insulating layer at a position of the excavated portion.

5. The organic electroluminescence device according to claim 3, wherein
the edge cover layer covers the first reflective layer, and
the first electrode is provided inside the excavated portion.

6. The organic electroluminescence device according to claim 1, wherein the first end portion of the first reflective layer is positioned inside the excavated portion.

7. The organic electroluminescence device according to claim 1, further comprising:
an active element, whose light emission can be controlled independently for each of the first unit light emitting region and the second unit light emitting region.

8. The organic electroluminescence device according to claim 7, wherein an electrode wiring line of the active element and the first reflective layer are provided inside the excavated portion via an insulating film interposed between the electrode wiring line of the active element and the first reflective layer.

9. The organic electroluminescence device according to claim 8, wherein the base material is exposed via a second through-hole defined in the electrode wiring line.

10. The organic electroluminescence device according to claim 1, wherein a width of the excavated portion is larger than a diameter of the first recessed portion.

11. A method for producing an organic electroluminescence device, the method comprising:
forming a first recessed portion, a second recessed portion, and an excavated portion in an insulating layer provided on a base material;
forming a first reflective layer at least along a surface of the first recessed portion;
forming a second reflective layer at least along a surface of the second recessed portion;
forming a filling layer having optical transparency on an inside of the first recessed portion and the second recessed portion via the first reflective layer and the second reflective layer;
forming a first electrode and a second electrode having optical transparency on at least an upper layer side of the filling layer;
forming an organic layer containing at least a light-emitting layer on an upper layer side of the first electrode and the second electrode; and
forming a third electrode having optical transparency and light reflectivity on an upper layer side of the organic layer, wherein
when forming the first recessed portion, the second recessed portion, and the excavated portion, the first recessed portion is formed in a first unit light emitting region, the second recessed portion is formed in a second unit light emitting region, the first unit light emitting region and the second unit light emitting region being separated from one another and adjacent to each other,
the first unit light emitting region includes the base material, the insulating layer, the first reflective layer, the filling layer, the first electrode, the organic layer, the third electrode, and the edge cover layer,
the second unit light emitting region includes the base material, the insulating layer, the second reflective layer, the filling layer, the second electrode, the organic layer, the third electrode, and the edge cover layer,
when forming the excavated portion, the excavated portion is formed between the first unit light emitting region and the second unit light emitting region,
when forming the filling layer, at least the filling layer is provided inside the excavated portion,
when forming the first reflective layer and the second reflective layer, the first reflective layer and the second reflective layer are provided on an inside of the excavated portion, and extend along a base of the excavated portion, and
when forming the filling layer, a portion of the filling layer is exposed from between the first electrode and the second electrode.

12. The method for producing the organic electroluminescence device according to claim 11, wherein when forming the filling layer, at least portions of the first reflective layer at positions of the first recessed portion and the excavated portion are exposed by subjecting a light-transmissive resin film formed on the base material to aching.

13. The method for producing the organic electroluminescence device according to claim 11, wherein when forming the excavated portion, the insulating layer is penetrated in a film thickness direction at a position of the excavated portion.

14. The method for producing the organic electroluminescence device according to claim 13, the method comprising:

forming an active element, whose light emission can be controlled independently for each of the first unit light emitting region and the second unit light emitting region, on the base material, wherein in this step, the electrode wiring line of the active element is penetrated in the film thickness direction at the position of the excavated portion.

15. An illumination device comprising:

a base material;

an insulating layer provided on the base material and provided with a first recessed portion and a second recessed portion on an upper face of the insulating layer;

a first reflective layer provided on at least a surface of the first recessed portion;

a second reflective layer provided on at least a surface of the second recessed portion;

a filling layer having optical transparency and filling an inside of the first recessed portion and the second recessed portion via the first reflective layer and the second reflective layer;

a first electrode and a second electrode having optical transparency and provided on at least an upper layer side of the filling layer;

an organic layer containing at least a light-emitting layer provided on an upper layer of the first electrode and the second electrodes;

a third electrode having optical transparency and provided on an upper layer side of the organic layer;

an edge cover layer covering at least a first end portion of the first electrode and a second end portion of the second electrode;

a first unit light emitting region and a second unit light emitting region that are separated from one another and adjacent to each other; and an excavated portion in the insulating layer between the first unit light emitting region and the second unit light emitting region, wherein the first unit light emitting region includes the base material, the insulating layer, the first reflective layer, the filling layer, the first electrode, the organic layer, the third electrode, and the edge cover layer, the second unit light emitting region includes the base material, the insulating layer, the second reflective layer, the filling layer, the second electrode, the organic layer, the third electrode, and the edge cover layer, at least the filling layer is provided inside the excavated portion, the first reflective layer and the second reflective layer are provided on an inside of the excavated portion, and extend along a base of the excavated portion, and a portion of the filling layer is exposed from between the first electrode and the second electrode.

16. The organic electroluminescence device according to claim 3, wherein the insulating layer is a flattening resin layer, the first reflective layer is defined on an upper face of the flattening resin layer including an inner face of the first recessed portion, the first electrode is defined across an upper face of the filling layer and an upper face of the first reflective layer, the first electrode has a level difference at an edge of the first recessed portion, and the first reflective layer and the first electrode that are defined in the first recessed portion are electrically connected to one another at an overlapping portion of the first reflective layer and the first electrode.

* * * * *